US010796062B2

(12) United States Patent
Yazdani et al.

(10) Patent No.: US 10,796,062 B2
(45) Date of Patent: Oct. 6, 2020

(54) FULL-CUSTOM VOLTAGE-DEPENDENT DESIGN RULES (VDRC) FLOW

(71) Applicant: Synopsys, Inc., Mountain View, CA (US)

(72) Inventors: Nabil Yazdani, Nepean (CA); Donald Oriordan, Mountain View, CA (US); Jingyu Xu, Beijing (CN); Bulent Basaran, Atlanta, GA (US); Larissa Nitchougovskaia, Markham (CA)

(73) Assignee: SYNOPSYS, INC., Mountain View, CA (US)

( * ) Notice: Subject to any disclaimer, the term of this patent is extended or adjusted under 35 U.S.C. 154(b) by 79 days.

(21) Appl. No.: 15/989,929

(22) Filed: May 25, 2018

(65) Prior Publication Data

US 2018/0341742 A1 Nov. 29, 2018

Related U.S. Application Data

(60) Provisional application No. 62/511,238, filed on May 25, 2017.

(51) Int. Cl.
*G06F 17/50* (2006.01)
*G06F 16/00* (2019.01)
(Continued)

(52) U.S. Cl.
CPC .......... *G06F 30/398* (2020.01); *G06F 16/211* (2019.01); *G06F 16/245* (2019.01);
(Continued)

(58) Field of Classification Search
None
See application file for complete search history.

(56) References Cited

U.S. PATENT DOCUMENTS 8,732,631 B2 * 5/2014 Fang ...................... G06F 30/30
716/102
8,904,326 B2 * 12/2014 Huang ................ G06F 17/5036
716/106

(Continued)

OTHER PUBLICATIONS

T. Toyoda et al., "A Fully Integrated Characterization and Management System for ASIC Libraries," 1992 Fifth Annual IEEE Int'l ASIC Conference and Exhibit, pp. 245-248. (Year: 1992).*

*Primary Examiner* — Leigh M Garbowski
(74) *Attorney, Agent, or Firm* — Alston & Bird LLP

(57) ABSTRACT

The independent claims of this patent signify a concise description of embodiments. Embodiments described herein are directed to a database-driven scheme for automating the process of VDRC checking in a full-custom EDA Design and Implementation tool. Various embodiments include at least a computer-implemented method of performing Voltage-based Design Rule Checking (VDRC) in a full-custom EDA Design and Implementation Platform is provided, the method comprising receiving a plurality of net voltages from at least a first net and a second net, wherein reception of the plurality of net voltages is from one or more of a simulation, a plurality of simulations, manual override, or direct input, determining a net voltage range, the net voltage range being a difference between a first net voltage of a first net and a second net voltage of a second net, causing transfer of the net voltage range to a layout editing process, the layout editing process resulting in generating a layout, and performing VDRC verification, confirming a VDRC clean layout. This Abstract is not intended to limit the scope of the claims.

53 Claims, 26 Drawing Sheets

(51) Int. Cl.
  *G06F 30/398*      (2020.01)
  *G06F 16/21*      (2019.01)
  *G06F 16/245*      (2019.01)
  *G06F 30/31*      (2020.01)
  *G06F 30/367*      (2020.01)
  *G06F 30/337*      (2020.01)
  *G06F 30/373*      (2020.01)
  *G06F 30/30*      (2020.01)
  *G06F 30/3308*      (2020.01)
  *G06F 30/33*      (2020.01)

(52) U.S. Cl.
  CPC .............. *G06F 30/31* (2020.01); *G06F 30/30* (2020.01); *G06F 30/33* (2020.01); *G06F 30/337* (2020.01); *G06F 30/3308* (2020.01); *G06F 30/367* (2020.01); *G06F 30/373* (2020.01); *G06F 2201/80* (2013.01)

(56) References Cited

U.S. PATENT DOCUMENTS

| | | | | |
|---|---|---|---|---|
| 8,943,454 | B1* | 1/2015 | Hsiao | G06F 17/5081 |
| | | | | 716/113 |
| 9,262,574 | B2* | 2/2016 | Tomblin | G06F 17/5081 |
| 9,501,593 | B2* | 11/2016 | Huang | G06F 17/5036 |
| 2009/0031264 | A1* | 1/2009 | Rittman | G06F 17/5081 |
| | | | | 716/106 |
| 2019/0065647 | A1* | 2/2019 | Chen | G06F 17/5036 |

\* cited by examiner

300

500

600

700

900

1000

1300

1400

1700

1900

2000

2300

2400

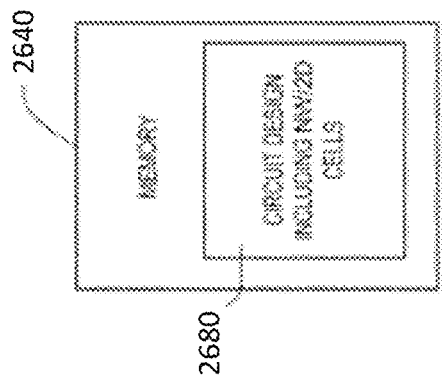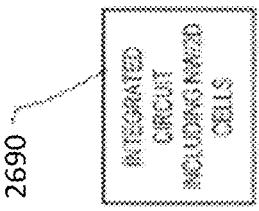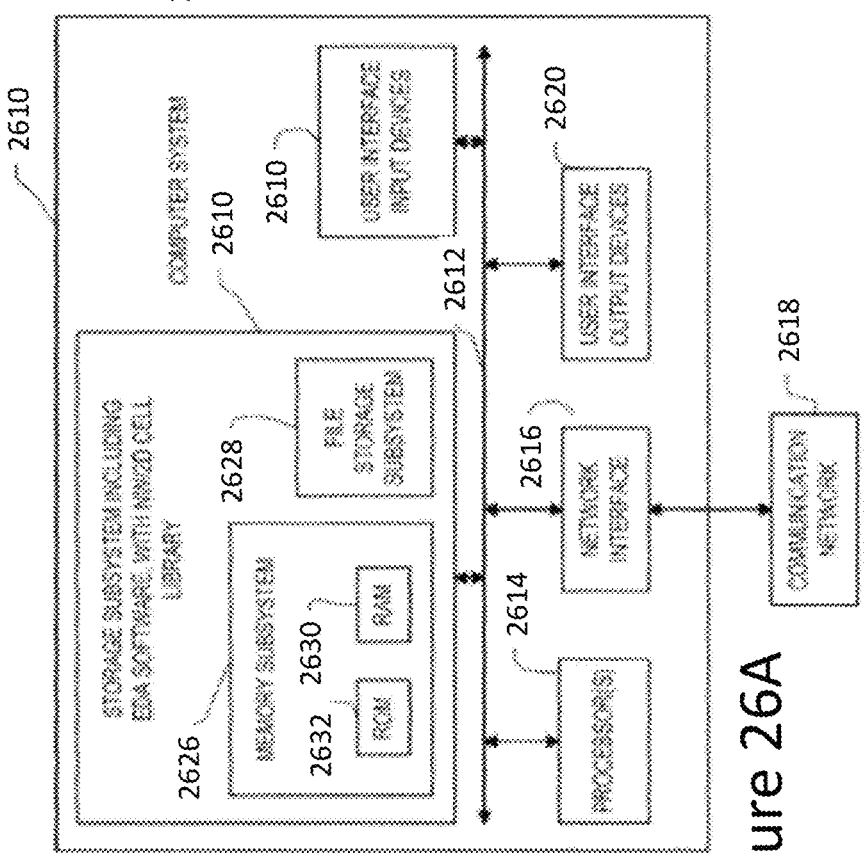
Figure 26A
Figure 26B
Figure 26C

FULL-CUSTOM VOLTAGE-DEPENDENT DESIGN RULES (VDRC) FLOW

CROSS REFERENCE TO RELATED APPLICATIONS

The present application claims benefit under 35 USC 119(e) of Application Ser. No. 62/511,238, filed May 25, 2017, the content of which is incorporated herein by reference in its entirety.

COPYRIGHT NOTICE

The assignee of this patent document has no objection to the facsimile reproduction by anyone of the patent document itself or of the patent application, as it appears in the files of the United States Patent and Trademark Office, but otherwise reserves all rights whatsoever in any included works of authorship protected by copyright.

SPECIFICATION—DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

Design Rule Manuals (DRMs) have long had voltage-dependent spacing rules, such as for example, generally, the larger the voltage difference between two adjacent nets, the further apart they should be spaced. These rules apply when multiple nets at different voltages are routed close together within a common neighborhood, and seek to ensure signal integrity and long term device reliability. Placing nets near each other saves space and keeps an IC small. But placing nets too near each other risks dielectric breakdown and parasitic capacitance.

Conventional design approaches include mark different regions of the layout as depending to one voltage domain or another (e.g. using a polygon on a special marker layer), and enhancing the verification tools to consult these marker layers to determine the appropriate spacing requirements, flagging any violations. This approach worked when there were relatively few voltage domains and the layout was closely partitioned with the different domains implemented in different blocks, but didn't work so well when there were multiple voltage domains, or when the simple partitioning scheme wasn't possible due to layout area concerns, place and route concerns, etc. That approach also relies on the layout designer knowing what the various net voltages or voltage domains are (they don't always know, though the front-end circuit designer may know), and further relies on the layout designer remembering to create the polygons on the special marker layer (they don't always remember to do so). In lieu of these pieces all being in place, overly pessimistic minimum spacing rules are often used which is wasteful of silicon area. For example, large voltage-based spacing is often used between nets across which voltage deltas are quite small in practice, resulting in nets which could be routed closer together but aren't. Static-analysis based approaches (commonly used in digital design flows) that attempt to propagate net voltages via voltage propagation algorithms using channel connected regions tend to produce overly pessimistic spacing's in full custom design flows. Various ad-hoc scripts have been employed to try and improve the situation, but these tend to be limited, non-standard (don't work uniformly across multiple Foundry's/PDK's or Verification tools), and come with various usability issues.

With reliability and signal integrity concerns becoming more of a problem in small geometry processes, there is a need for a full front-to-back Voltage Based Design-Rule Checking flow that is natively built into custom EDA platforms, such as the Synopsys Galaxy Custom Compiler. Such a flow needs to allow voltage information to be automatically determined from dynamic simulation methods, and to be over-ridden where appropriate (e.g. in IP-reuse or ECO scenarios) in a context aware/hierarchical manner. The flow needs to allow significant inputs from the Circuit Designer (front-end engineer), to guide the layout using their design context-aware expert knowledge. The flow needs to automate the propagation of the net voltages & overrides to the layout and to the verification tools, to allow the inspection/debug of any conflicts, and to handle a variety of sources of input voltage range information in a uniform way. To satisfy the needs of full custom IC designers, and cater to late-stage ECO changes, the flow needs to allow interactive user input relating to VDRC via schematic and layout canvas operations among other means.

SUMMARY

The claims signify a brief description of one or more of the innovations, embodiments, and/or examples found within this disclosure In some embodiments, a computer-implemented method of performing Voltage-based Design Rule Checking (VDRC) in a full-custom EDA Design and Implementation Platform is provided, the method comprising receiving a plurality of net voltages from at least a first net and a second net, wherein reception of the plurality of net voltages is from one or more of a simulation, a plurality of simulations, manual override, or direct input, determining a net voltage range, the net voltage range being a difference between a first net voltage of a first net and a second net voltage of a second net, causing transfer of the net voltage range to a layout editing process, the layout editing process resulting in generating a layout, and performing VDRC verification, confirming a VDRC clean layout.

In some embodiments, the first net voltage of the first net is a minimum net voltage of the first net and the second net voltage of the second net is a maximum net voltage of the second net.

In some embodiments, the method further comprising accessing a VDRC configuration database, the VDRC configuration database configured to store design intent information, design intent information comprising one or more of information indicating which one of one or more simulation results are to be used, if any, information indicating how multiple voltages from different simulations are to be aggregated, information indicating simulation node voltages, and information indicating designer override values. In some embodiments, the method further comprising saving to a VDRC configuration database, the net voltage range for each design net determined during a dynamic simulation.

In some embodiments, the method further comprising generating the VDRC configuration database utilizing simulation waveform data from a previously performed simulation. In some embodiments, receiving the voltages comprises selectively querying, from the VDRC database, net voltages on all nets, which were obtained during a dynamic simulation.

In some embodiments, receiving the voltages comprises allowing results of multiple dynamic simulations, each performed over at least one of a different pressure, volume, and temperature condition, or different test bench setup to be combined, resolved, or combined and resolved in the querying.

In some embodiments, receiving the voltages comprises persisting, in the VDRC configuration database, user-specified preferences for resolving results of multiple dynamic simulations, enabling the results of multiple dynamic simulations to be resolved and used in future design sessions.

In some embodiments, receiving the voltages comprises providing a user interface configured to allow user input indicating overriding voltage ranges in the layout via creation of vflag cells override. In some embodiments, the method further comprising identifying and resolving one or more voltage range conflicts in the presence of hierarchical designs. In some embodiments, receiving the voltages comprises providing a user interface configured to receive, directly, voltage override data, without having first ran any simulations.

In some embodiments, the user interface is configured to receive, directly, the voltage override data via a tabular method to visualize and override the voltage ranges in a circuit schematic. In some embodiments, the the user interface is configured to receive, directly, the voltage override data via a graphical on-canvas method. In some embodiments, the user interface is configured to receive, directly, the voltage override data via a tabular method to visualize and override the voltage ranges in a circuit schematic and via the graphical on-canvas method.

In some embodiments, the method further comprising providing a user interface configured to display simulation-based data, voltage override data, or the resolved data, wherein the voltage override data is of highest precedence. In some embodiments, the method further comprising persisting the voltage range information and voltage override data to storage.

In some embodiments, the method further comprising allowing dynamic simulation voltage range information to be persisted such that it can be shared across network partitions with different mount points, or to be managed, managing comprising being checked in and versioned.

In some embodiments, the method further comprising identifying and resolving any voltage range conflicts in the presence of hierarchical designs. In some embodiments, the method further comprising overriding the voltage ranges within the layout. In some embodiments, the method further comprising receiving voltage override data for overriding the net voltage range in the layout via creation of vflag cells in the layout.

In some embodiments, the method further comprising enforcing the spacing rules during interactive operation of the layout editor. In some embodiments, the method further comprising preventing any edits to any of the first net or second net that would result in a VDRC-related spacing violation.

In some embodiments, the method further comprising determining whether net voltage changes introduced subsequent to layout requires modifications to the layout. In some embodiments, the method further comprising providing an indication, via the user interface, indicating whether the displayed voltage ranges have been explicitly overridden. In some embodiments, the method further comprising causing display, via a user interface, of the voltage ranges within the layout. In some embodiments, the method further comprising exporting a resolved set of voltage ranges using Verification-tool-specific encoding for final verification. In some embodiments, the method further comprising causing display, via the user interface, of any VDRC violations, as determined during verification, in the context of the layout.

In some embodiments, a system is provided for performing Voltage-based Design Rule Checking (VDRC) in a full-custom EDA Design and Implementation Platform, the system comprising at least one processor and at least one memory including computer program code, the at least one memory and the computer program code configured to, with the processor, cause the system to at least receive a plurality of net voltages from at least a first net and a second net, wherein reception of the plurality of net voltages is from one or more of a simulation, a plurality of simulations, manual override, or direct input, determine a net voltage range, the net voltage range being a difference between a first net voltage of a first net and a second net voltage of a second net, cause transfer of the net voltage range to a layout editing process, the layout editing process resulting in generating a layout, and perform VDRC verification, confirming VDRC clean layout.

In some embodiments, the first net voltage of the first net is a minimum net voltage of the first net and the second net voltage of the second net is a maximum net voltage of the second net. In some embodiments, the at least one memory and the computer program code are further configured to, with the processor, cause the system to access a VDRC configuration database, the VDRC configuration database configured to store design intent information, design intent information comprising one or more of information indicating which one of one or more simulation results are to be used, if any, information indicating how multiple voltages from different simulations are to be aggregated, information indicating simulation node voltages, and information indicating designer override values. In some embodiments, the at least one memory and the computer program code are further configured to, with the processor, cause the system to save to a VDRC configuration database, the net voltage range for each design net determined during a dynamic simulation.

In some embodiments, the at least one memory and the computer program code are further configured to, with the processor, cause the system to generate the VDRC configuration database utilizing simulation waveform data from a previously performed simulation. In some embodiments, receiving the voltages comprises selectively query, from the VDRC database, net voltages on all nets, which were obtained during a dynamic simulation.

In some embodiments, receiving the voltages comprises allow results of multiple dynamic simulations, each performed over at least one of a different pressure, volume, and temperature condition, or different test bench setup to be combined, resolved, or combined and resolved in the querying. In some embodiments, receiving the voltages comprises persist, in the VDRC configuration database, user-specified preferences for resolving results of multiple dynamic simulations, enabling the results of multiple dynamic simulations to be resolved and used in future design sessions.

In some embodiments, receiving the voltages comprises provide a user interface configured to allow user input indicating overriding voltage ranges in the layout via creation of vflag cells override. In some embodiments, the at least one memory and the computer program code are further configured to, with the processor, cause the system to identify and resolve one or more voltage range conflicts in the presence of hierarchical designs.

In some embodiments, receiving the voltages comprises providing a user interface configured to receive, directly, voltage override data, without having first ran any simulations. In some embodiments, the user interface is configured to receive, directly, the voltage override data via a tabular method to visualize and override the voltage ranges in a circuit schematic. In some embodiments, the user interface is configured to receive, directly, the voltage override data via a graphical on-canvas method. In some embodiments, the user interface is configured to receive, directly, the voltage override data via a tabular method to visualize and override the voltage ranges in a circuit schematic and via the graphical on-canvas method.

In some embodiments, the at least one memory and the computer program code are further configured to, with the processor, cause the system to provide a user interface configured to display simulation-based data, voltage override data, or the resolved data, wherein the voltage override data is of highest precedence. In some embodiments, the at least one memory and the computer program code are further configured to, with the processor, cause the system to persist the voltage range information and voltage override data to storage. In some embodiments, the at least one memory and the computer program code are further configured to, with the processor, cause the system to allow dynamic simulation voltage range information to be persisted such that it can be shared across network partitions with different mount points, or to be managed, managing comprising being checked in and versioned.

In some embodiments, the at least one memory and the computer program code are further configured to, with the processor, cause the system to identify and resolve any voltage range conflicts in the presence of hierarchical designs.

In some embodiments, the at least one memory and the computer program code are further configured to, with the processor, cause the system to override the voltage ranges within the layout. In some embodiments, the at least one memory and the computer program code are further configured to, with the processor, cause the system to receive voltage override data for overriding the net voltage range in the layout via creation of vflag cells in the layout.

In some embodiments, the at least one memory and the computer program code are further configured to, with the processor, cause the system to enforce the spacing rules during interactive operation of the layout editor. In some embodiments, the at least one memory and the computer program code are further configured to, with the processor, cause the system to prevent any edits to any of the first net or second net that would result in a VDRC-related spacing violation. In some embodiments, the at least one memory and the computer program code are further configured to, with the processor, cause the system to determine whether net voltage changes introduced subsequent to layout requires modifications to the layout.

In some embodiments, at least one memory and the computer program code are further configured to, with the processor, cause the system to provide an indication, via the user interface, indicating whether the displayed voltage ranges have been explicitly overridden. In some embodiments, the at least one memory and the computer program code are further configured to, with the processor, cause the system to cause display, via a user interface, of the voltage ranges within the layout. In some embodiments, the at least one memory and the computer program code are further configured to, with the processor, cause the system to export a resolved set of voltage ranges using verification-tool-specific encoding for final verification. In some embodiments, at least one memory and the computer program code are further configured to, with the processor, cause the system to cause display, via the user interface, of any VDRC violations, as determined during verification, in the context of the layout.

In some embodiments, a computer program product for performing Voltage-based Design Rule Checking (VDRC) in a full-custom EDA Design and Implementation Platform is provided, the computer program product comprising at least one non-transitory computer-readable storage medium having computer-executable program code instructions stored therein, the computer-executable program code instructions comprising program code instructions for receiving a plurality of net voltages from at least a first net and a second net, wherein reception of the plurality of net voltages is from one or more of a simulation, a plurality of simulations, manual override, or direct input, determining a net voltage range, the net voltage range being a difference between a first net voltage of a first net and a second net voltage of a second net, causing transfer of the net voltage range to a layout editing process, the layout editing process resulting in generating a layout, and performing VDRC verification, confirming a VDRC clean layout.

BRIEF DESCRIPTION OF THE DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 26A, 26B, and 26C are simplified block diagrams of a computer system suitable for use with embodiments of the technology, as well as circuit design and circuit embodiments of the technology.

DETAILED DESCRIPTION

Figure 1:
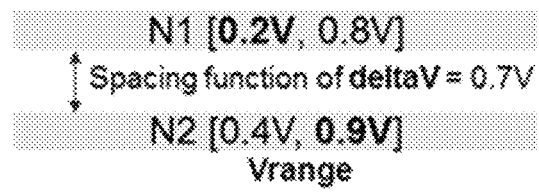
FIG. 1 is a graphical illustration of voltage-based spacing rules.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Embodiments described herein include a database-driven scheme for automating the process of VDRC checking in a full-custom EDA Design and Implementation tool, and related flowcharts and data flows. Embodiments include, in particular, automatic determination of net voltage ranges via dynamic simulation, manual override of net voltage ranges using, for example, a designer's expert knowledge, and automatic annotation of those net voltages onto the layout database such that they are processed by sign-off verification tools in addition to enabling productivity enhancing features within the interactive layout tools themselves.

Embodiments described herein included a plurality of features and/or mechanism that may be implemented, for example, in a custom compiler platform including, an a-priori mechanism to automatically setup & save to a database the voltage ranges on all design nets determined during a dynamic simulation performed by a Circuit Designer, a post-priori mechanism to create such a database given the existence of simulation waveform data from a previously performed simulation, a mechanism to selectively query (from the database) the voltage ranges on all nets which were obtained during dynamic simulation by the Circuit Designer, a user-configurable mechanism to allow the results of multiple dynamic simulations (e.g. those performed over different PVT corner conditions, different testbench setups etc.) to be combined/resolved in such queries, a mechanism to persist the user-specified preferences for resolving the results of multiple dynamic simulations, so that they may be used in future design sessions, a mechanism to enter voltage overrides directly, without having first ran any simulations, a mechanism to easily visualize the voltage ranges for nets of interest in circuit schematics, with minimal zoom or mouse click operations, a mechanism to override (and again visualize) the voltage ranges for nets of interest in circuit schematics, thus benefiting from Circuit Designer's knowledge of their circuit design including: a tabular method to visualize and override the voltage ranges in a circuit schematic, a graphical on-canvas method to do likewise in a circuit schematic, creation of vflag instances within a schematic (or layout) that convey override voltages, or a combination of the above two methods. Some embodiments include a means for syncing the two data sources (circuit schematic or VDRC config), identifying and resolving any conflicts), a mechanism to view the simulation-based data, or the override data, or the resolved data where the override data takes higher precedence, a mechanism to persist voltage range information and any such overrides to storage, a mechanism to allow dynamic simulation voltage range information to be persisted such that it can be shared across network partitions with different mount points, a mechanism to easily filter nets based on net names and/or voltage ranges, when visualizing or overriding the voltage ranges for design nets in large designs, a mechanism to identify whether the visualized voltage ranges have been explicitly overridden or not, a mechanism for identifying and resolving any voltage range conflicts in the presence of hierarchical designs, a mechanism to automatically transfer Circuit Designer (front-end) based Voltage Information to Layout when using Schematic Driven Layout, a mechanism for visualizing the voltage ranges within the layout, a mechanism for overriding the voltage ranges within the layout (The use of this mechanism is optional, as in many cases the front-end designers will not tolerate the layout engineers making any such changes), a mechanism to override voltage ranges in layout via the creation of vflag cells in layout. This may allow the flow to be used in situations where Schematic Driven Layout (involves a tight connection between schematic and layout editors with full correspondence between devices in both tools) is not being used. Additionally, some embodiments may include a mechanism for determine whether net voltage changes introduced via late stage ECO (Engineering Change Order) modifications to the layout need to be further considered, a mechanism for enforcing the spacing rules during interactive operation of the layout editor, and by batch mode place and route tools that interact with that editor, a mechanism to export the resolved set of voltage ranges using the Foundry and/or Verification-tool-specific encoding (markers and label syntax and layers) for final verification. These can also be included into Stream-Out operations when creating GDSII data for example. Other embodiments may include a mechanism for displaying any VDRC violations (determined by the verification tool) in the context of the layout.

Embodiments described herein include the VDRC Configuration Cellview and its constituent Database, for example, which maybe configured to store data indicative of, for example, the designer's intent, which may comprise any one or more of which simulation results are to be used, if any, how multiple voltages from different simulations are to be aggregated, storage of the (optional) simulation node voltages and designer override values themselves. This flexibility using the VDRC config database as a middle man allows different back end flows and tools to be used.

Embodiments described herein may further include the a-priori mechanism to automatically save to a database the voltage ranges on all design nets during dynamic simulation performed by a Circuit Designer, the post-priori mechanism to create such a database given the existence of simulation waveform data, functionality enabling entering and/or receiving of voltage overrides directly, without having first ran any simulations, the mechanism to query (from the database) the voltage ranges on all nets which were obtained during dynamic simulation by the Circuit Designer, the (aggregration) mechanism to allow the results of multiple dynamic simulations (e.g. those performed over different PVT corner condition, different testbench setups etc.) to be combined/resolved in such queries, the mechanism to persist the user-specified preferences for resolving the results of multiple dynamic simulations, so that they may be used in future design sessions, the mechanism to easily visualize the voltage ranges for nets of interest in circuit schematics, with minimal zoom or mouse click operations, the mechanism to override the voltage ranges for nets of interest in circuit schematics, thus benefiting from Circuit Designer's knowledge of their circuit design including: a tabular method to visualize and override the voltage ranges in a circuit schematic, a graphical on-canvas method to do likewise in a circuit schematic, or a combination of the above two methods.

Embodiments described herein may further include a mechanism to view the simulation-based data, or the override data, or the resolved data where the override data takes higher precedence, the mechanism to persist voltage range information and any such overrides to storage, the mechanism to allow dynamic simulation voltage range information to be persisted such that it can be shared across network partitions with different mount points, or to be managed (checked in, and versioned) using Design Management software, the mechanism to easily filter nets based on net names and/or voltage ranges, when visualizing or overriding the voltage ranges for design nets in large designs, the mechanism for identifying and resolving any voltage range conflicts in the presence of hierarchical designs.

Embodiments described herein may further include a mechanism for overriding the voltage ranges within the layout, use of this mechanism being optional, as in many cases the front-end designers will not tolerate the layout engineers making any such changes, a mechanism to override voltage ranges in layout via the creation of vflag cells in layout, thus allowing the flow to be used in situations where Schematic Driven Layout (involves a tight connection between schematic and layout editors with full correspondence between devices in both tools) is not being used, the mechanism for determine whether net voltage changes introduced via late stage ECO (Engineering Change Order) modifications to the layout need to be further considered, the mechanism to automatically transfer Circuit Designer (front-end) based Voltage Information to Layout when using Schematic Driven Layout, and/or the mechanism to export the final set of voltage ranges to the appropriate markers or labels that are consulted by various back end verification flows, for various Foundries and PDKs.

Figure 2:
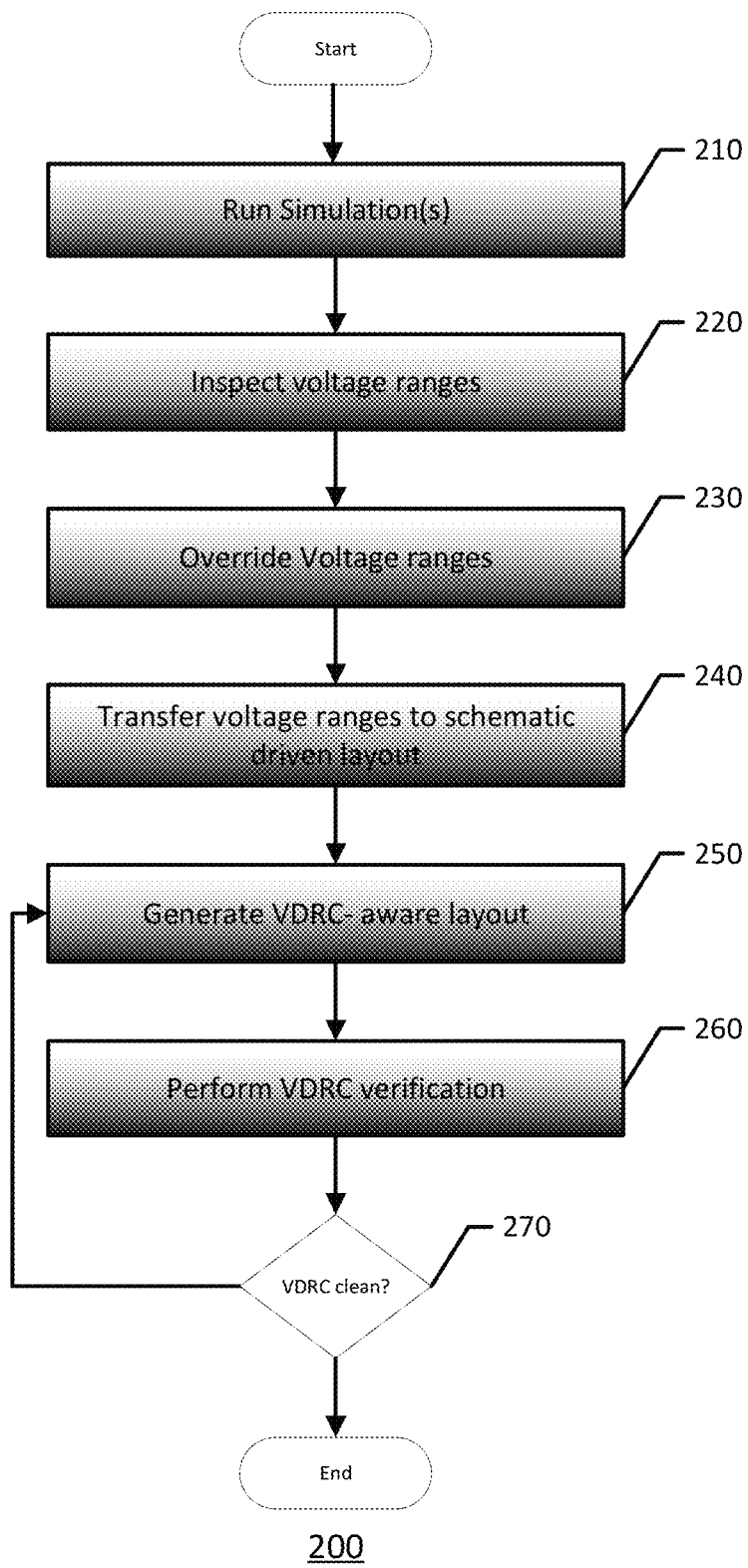
FIG. 2 shows a flow chart depicting an exemplary method for performing a full-custom VDRC in accordance with some exemplary embodiments of the present invention.

FIG. 2 shows a flow chart depicting an exemplary method for performing a full-custom VDRC in accordance with some exemplary embodiments of the present invention. As shown in block 210, a simulation or simulation may be run. For example, in some embodiments, a front-end Circuit Designer performs one (or more commonly, more than one) dynamic circuit simulation(s) to determine a baseline set of voltage ranges on each circuit net. As shown block 220, the voltage ranges may be inspected. As shown in block 230, the voltage ranges determined, in for example one or more simulations, may be overridden. That is, voltage over rides may be received from, for example, user input. For example, a circuit designer may use their circuit knowledge (of corner cases, IP-reuse context information, etc.) to override simulation results. The full set of data is then reconciled and transferred to layout, as shown in block 240, where the layout engineer attempts to create a VDRC-clean layout, as shown in block 250. In some embodiments, features within the layout tool help automate or assist with this process. After a layout is deemed complete, the sign off verification tools then perform the voltage-aware DRC checks (among other checks) as shown in block 260, and if the design is not found to be VDRC clean, as per the determination shown in block 270, the layout is modified accordingly. In an embodiment, additional overrides may be performed at this time by the front-end Circuit Designer and/or the back-end Layout Engineer, and the process followed until a VDRC clean design is achieved.

The process shown in FIG. 2 may also be followed in ECO (Engineering Change Order) scenarios, in which changes are introduced to the design at a late stage in the design process. Here, during the (re) simulation stage, the designer may be warned in an embodiment of any observed simulation voltages which exceed the voltage ranges previously annotated onto the design.

The process shown in FIG. 2 may also be modified to include parasitic and layout-dependent effect information extracted from the layout (so-called post-layout simulation). The presence of these post-layout effects may also cause variations in the simulated voltage ranges on various nets in the design, which can be inspected.

Figure 3:
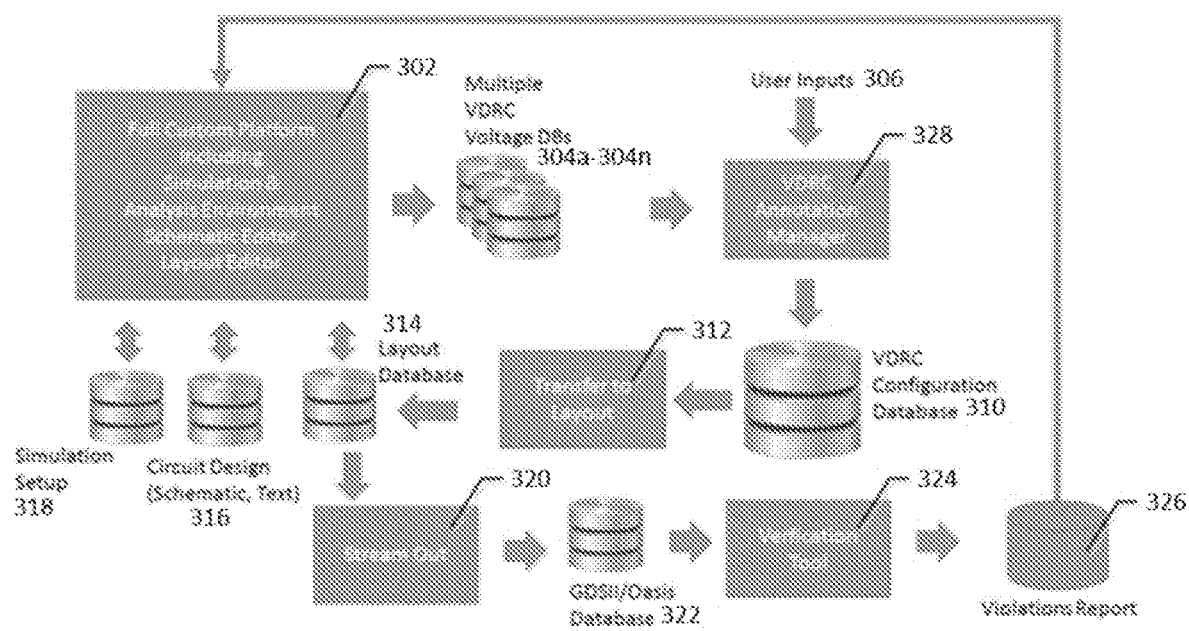
FIG. 3 shows a data flow diagram depicting an exemplary system process for performing the full-custom VDRC in accordance with some exemplary embodiments of the present invention.

A more detailed data flow diagram is shown in FIG. 3. FIG. 3 shows a data flow diagram depicting an exemplary system process for performing the full-custom VDRC in accordance with some exemplary embodiments of the present invention. Here, the schematic designer setups and simulates a circuit under a variety of conditions, producing a variety of simulation waveform databases (314, 316, 318). These are processed to extract voltage ranges for each net in the design, which are then persisted to one or more VDRC Voltage Databases 304a-304n. These databases are further considered via the VDRC Annotation Manager 328 (a component of the Platform), along with various user inputs 306 to produce a VDRC Configuration Database 310. The information queried from that database 310 and/or the VDRC Voltage Databases 304a-304n is then transferred into the layout design via a 'Transfer to Layout' step 312, and then finally fed to the layout verification tool 324, either directly via the layout design itself, or via a stream out operation 320 to a common data interchange format such as GDSII or Oasis 322. Details on these various steps and variations on these steps will be presented further below. The data from the VDRC Annotation Manager/Configuration Database 328/310 can also be queried and made available to subsequent simulation runs (arrow not shown) to determine if any observed voltages deviate significantly from the ranges determined by the VDRC Annotation Manager 328, as part of an ECO flow or IP-Reuse Scenario.

Figure 4:
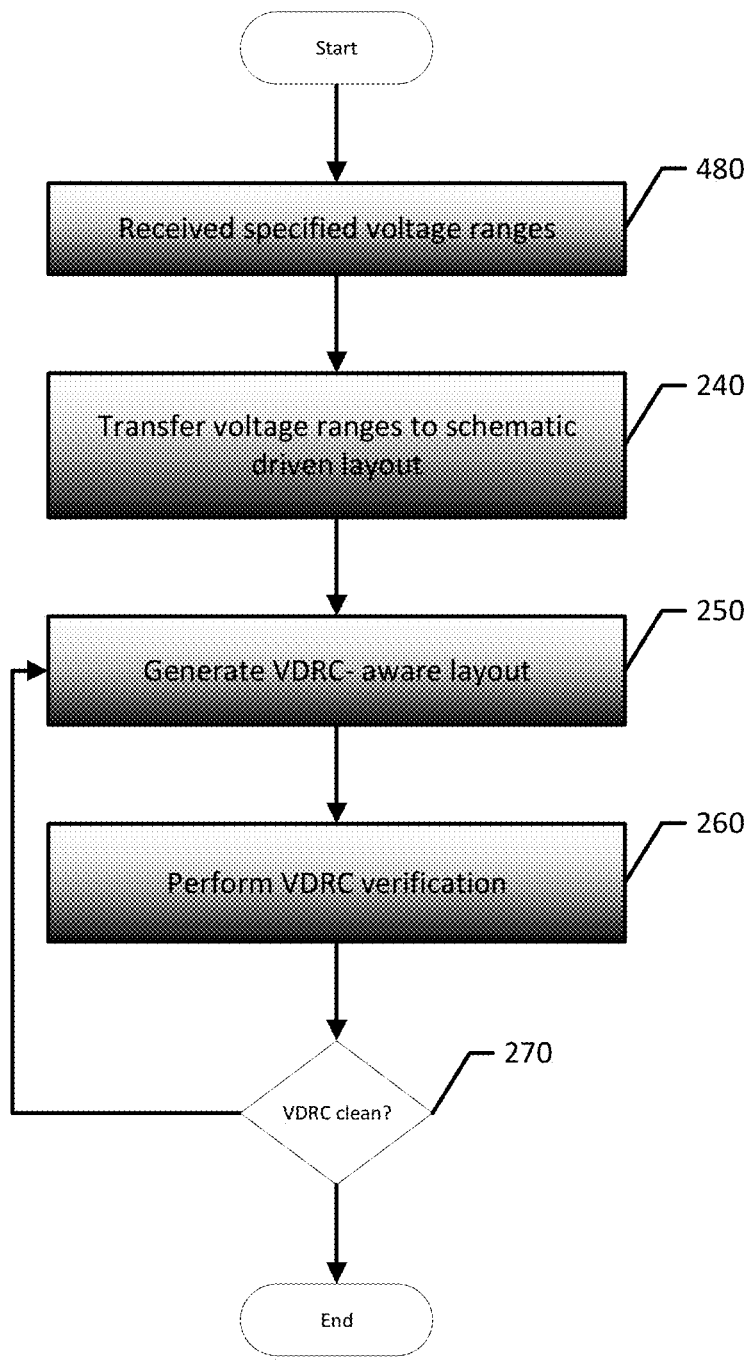
FIG. 4 shows a flow chart depicting a second exemplary method for performing a full-custom VDRC in accordance with some exemplary embodiments of the present invention.

In an alternate embodiment, the designer may choose to not use any simulation-driven voltage results, and may instead choose to directly enter voltage ranges. As such, as shown in block 480, In this situation, the system may receive specified voltage ranges. Tha tis, That is, because no simulations were run, there is essentially nothing being overridden. This process is shown in FIG. 4. That is, FIG. 4 shows a flow chart depicting a second exemplary method for performing a full-custom VDRC in accordance with some exemplary embodiments of the present invention.

Figure 5:
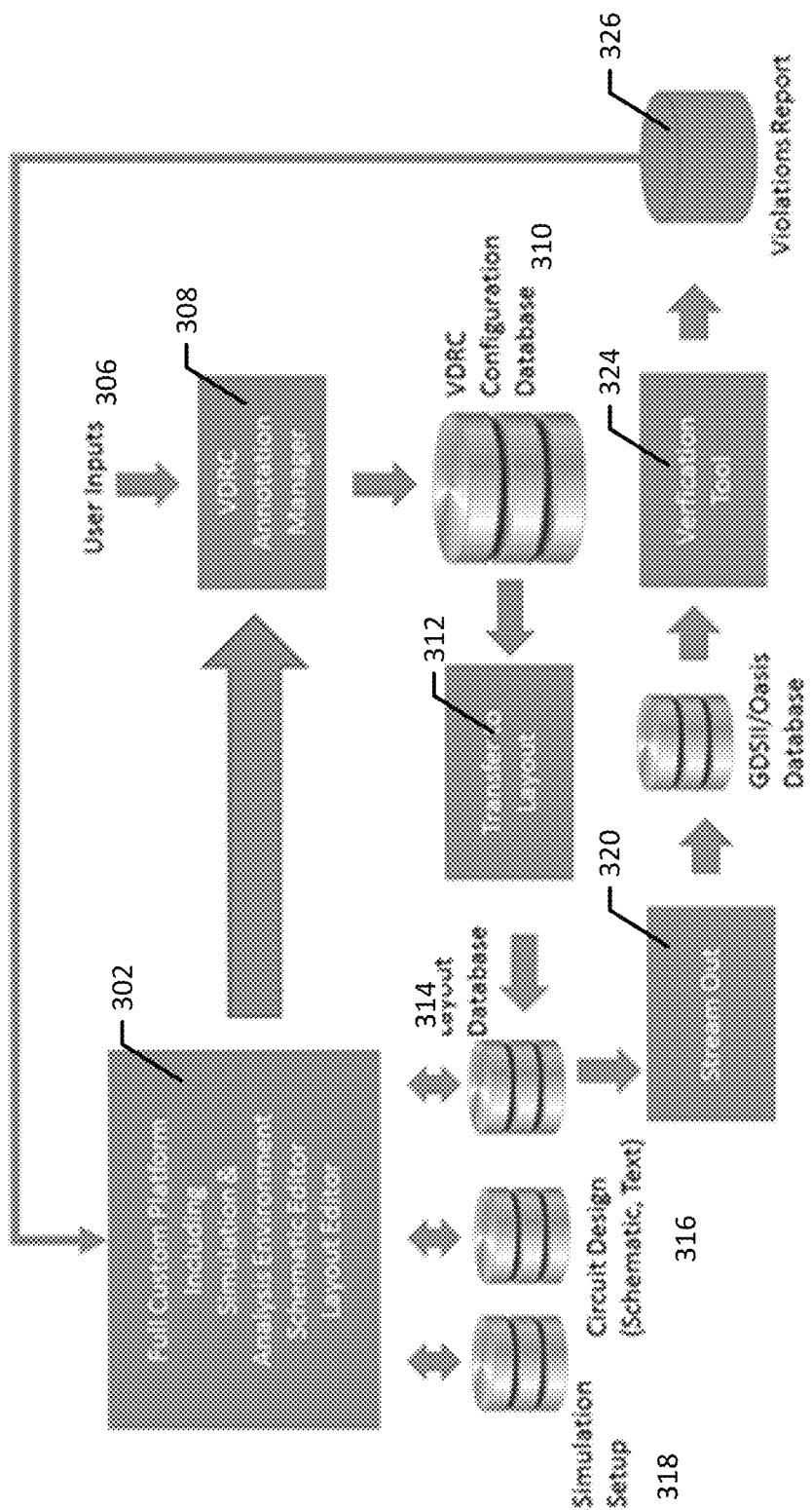
FIG. 5 shows a data flow diagram depicting a second exemplary system process for performing the full-custom VDRC in accordance with some exemplary embodiments of the present invention.

The corresponding data flow diagram is as shown in FIG. 5, in which a VDRC Configuration Database 310 is populated with user input 306 only, and no simulation results are required. In particular, FIG. 5 shows a data flow diagram depicting a second exemplary system process for performing the full-custom VDRC in accordance with some exemplary embodiments of the present invention.

A-Priori Setup & Saving Voltage Extremes Obtained from Dynamic Simulations

Figure 6:
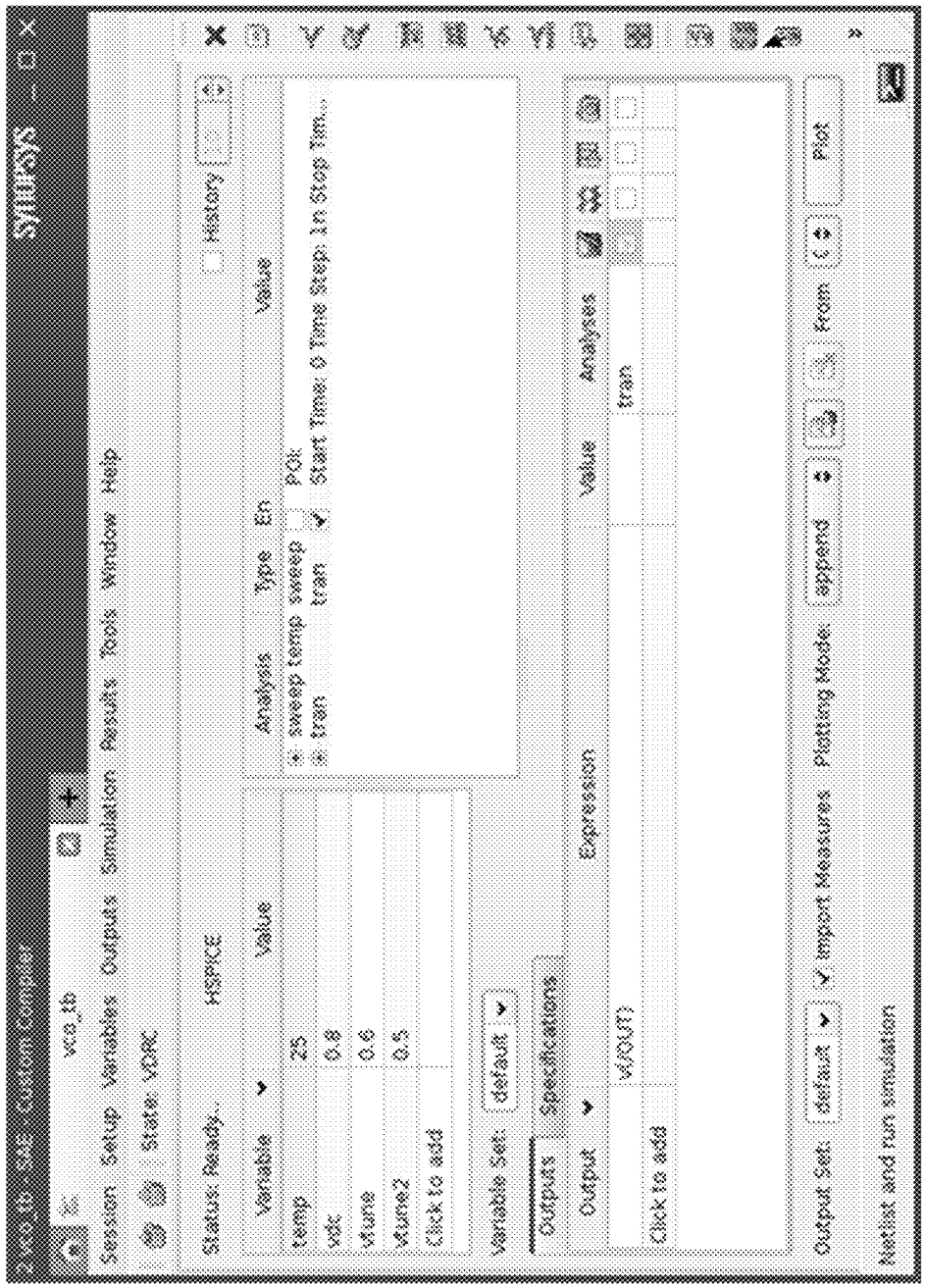
FIG. 6 shows a user interface configured to allow the user to manage all aspects of a circuit simulation.

SAE (Simulation & Analysis Environment) is an environment within the front end of the Custom Compiler (CC) Platform that is used by front end Circuit Designers to manage their simulation and testbench setup, enter various measurement expressions and specifications, run their simulations, and perform post processing on various simulation results. The tool is tightly integrated with the Schematic Editor application, and other portions of the CC tool suite. SAE (see FIG. 6) provides an intuitive GUI for allowing the user to manage all aspects of their circuit simulation.

Figure 7:
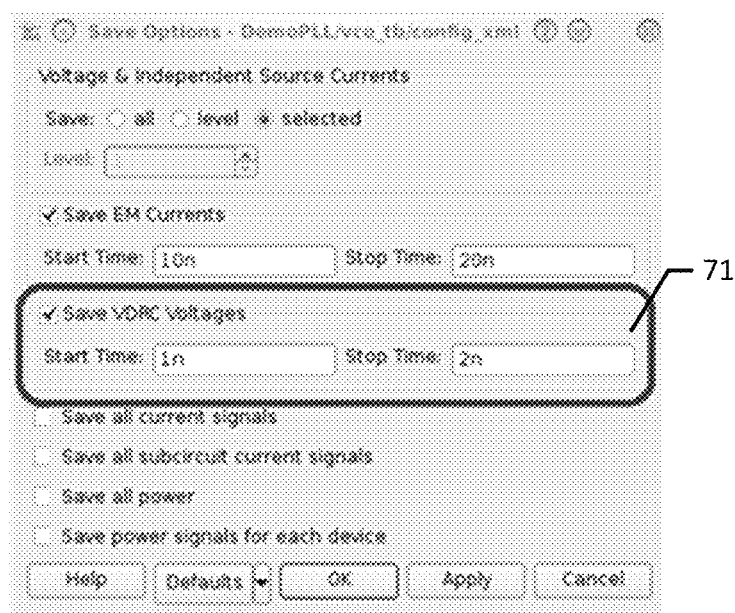
FIG. 7 shows user interface configured for the specifying of VDRC Voltages to be saved.
Figure 8:
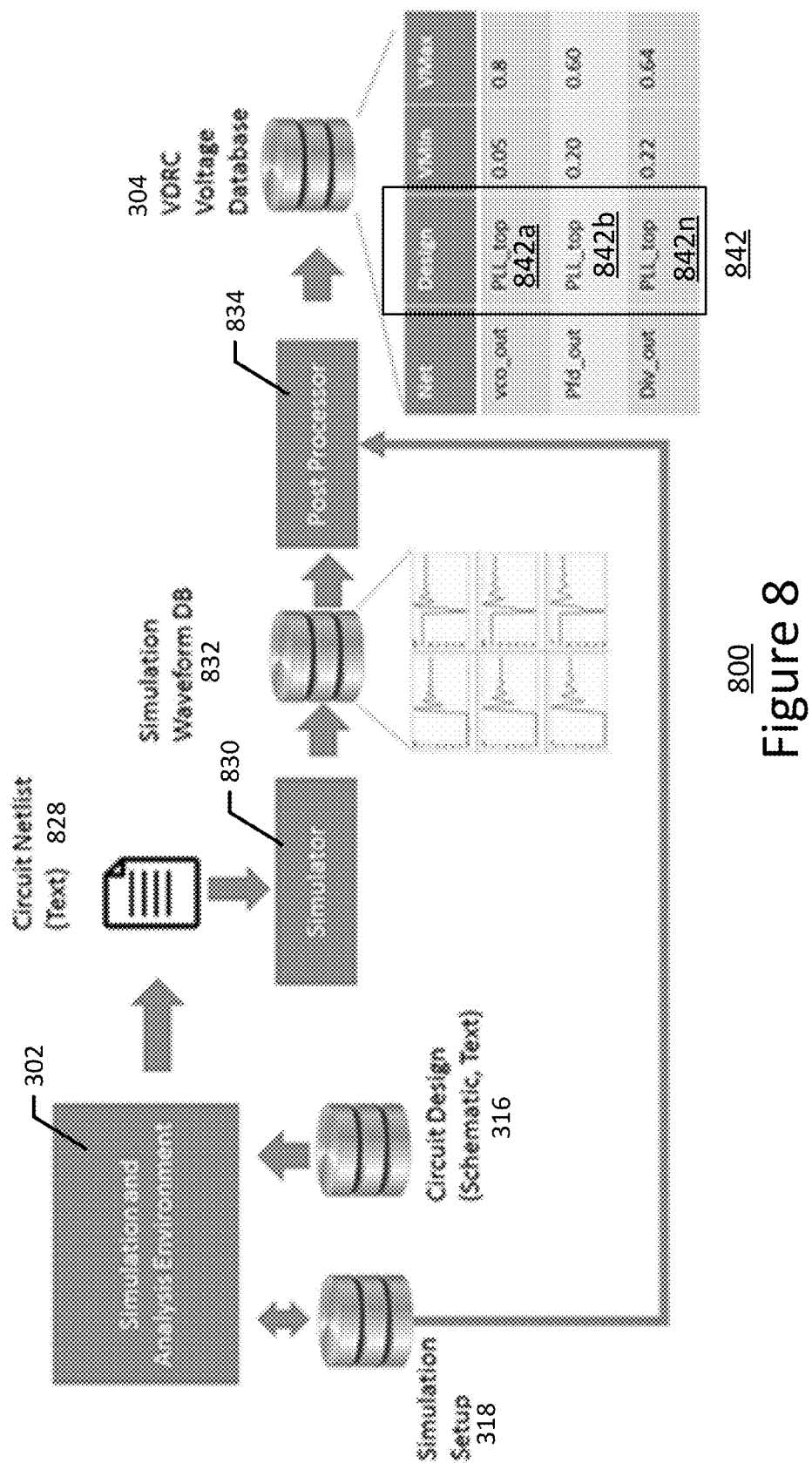
FIG. 8 shows a data flow diagram depicting an exemplary system process for performing auto-creation of a VDRC voltage database from a single dynamic simulation, in accordance with some exemplary embodiments of the present invention.

Among other things, SAE allows the user to control which node voltages and circuit branch/terminal currents are to be saved when performing dynamic circuit simulation. FIG. 7 shows user interface configured for the specifying of VDRC Voltages to be saved. When the 'Save VDRC Voltages' checkbox is checked, the SAE simulation flow is modified/extended (see FIG. 8) to automatically extract the min/max voltage range for each node in the design hierarchy. The extracted voltage ranges are then persisted to a VDRC database 304 after simulation. In particular, FIG. 8 shows a data flow diagram depicting an exemplary system process for performing auto-creation of a VDRC voltage database 304 from a single dynamic simulation 830.

Figure 9:
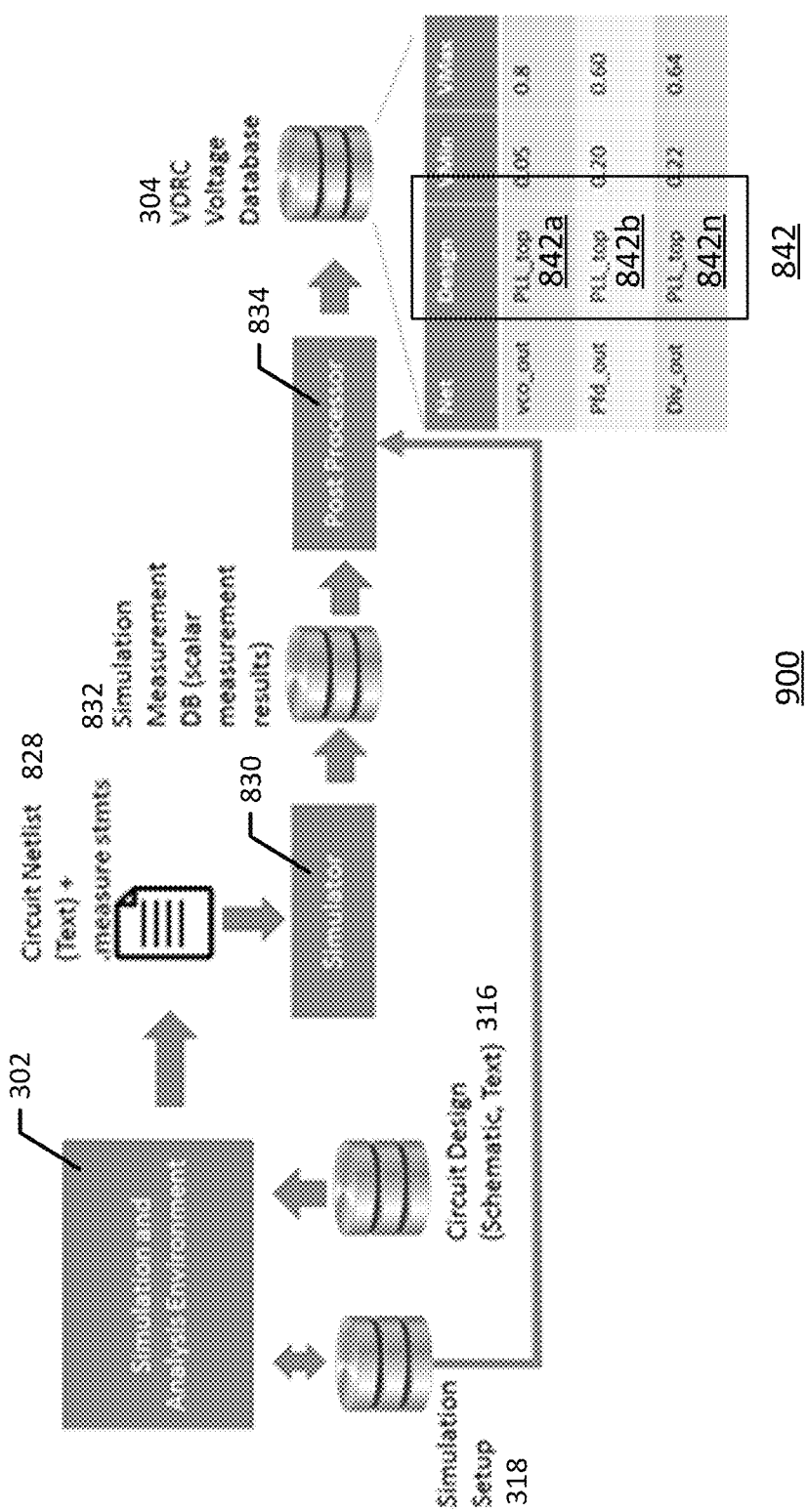
FIG. 9 shows a data flow diagram depicting an exemplary system process for performing a simulator-based determination of voltage extremes.

In some embodiments, this operation involves post-processing the circuit simulation (time domain) waveforms in the simulation waveform database to determine the min/max voltage values for each circuit node. In an embodiment, these post processing operations can be performed for voltage, time values within a user specified time window (from a given simulation Start Time to a given End Time). FIG. 7 shows how the VDRC simulation time window can be configured within the SAE tool, which is useful to allow any circuit simulation initial transient effects to settle down before the waveforms are processed. In some embodiments, the absolute min/max voltages for each circuit node are determined during the time window (if specified), or during the entire transient simulation (if no time window is specified). In some embodiments, a filtering mechanism (e.g., moving average algorithm) may additionally be used to suppress the effect of short transient voltage 'spikes' on simulation waveforms (some of which may be due to artifacts of the circuit simulator algorithms themselves for example). In an alternate embodiment, the waveform processing is performed during the transient simulation by the circuit simulator itself, rather than as a post-processing operation by the simulation and analysis environment. Here, the circuit netlist generated by the simulation and analysis environment is augmented with specific instructions encoded into the simulator input file (for example HSPICE .measure statements) that instruct the simulator 830 to itself measure the voltage min/max values during the simulation process. (Again, voltage spike suppression may be enabled via the inclusion of appropriate filtering expressions such as moving average operations, etc.). This is shown in FIG. 9, which shows a data flow diagram depicting an exemplary system process for performing a simulator-based determination of voltage extremes. A small post processor 834 takes the scalar measurement outputs 832 produced by the simulator itself, and converts the data to the VDRC Database format.

Figure 10:
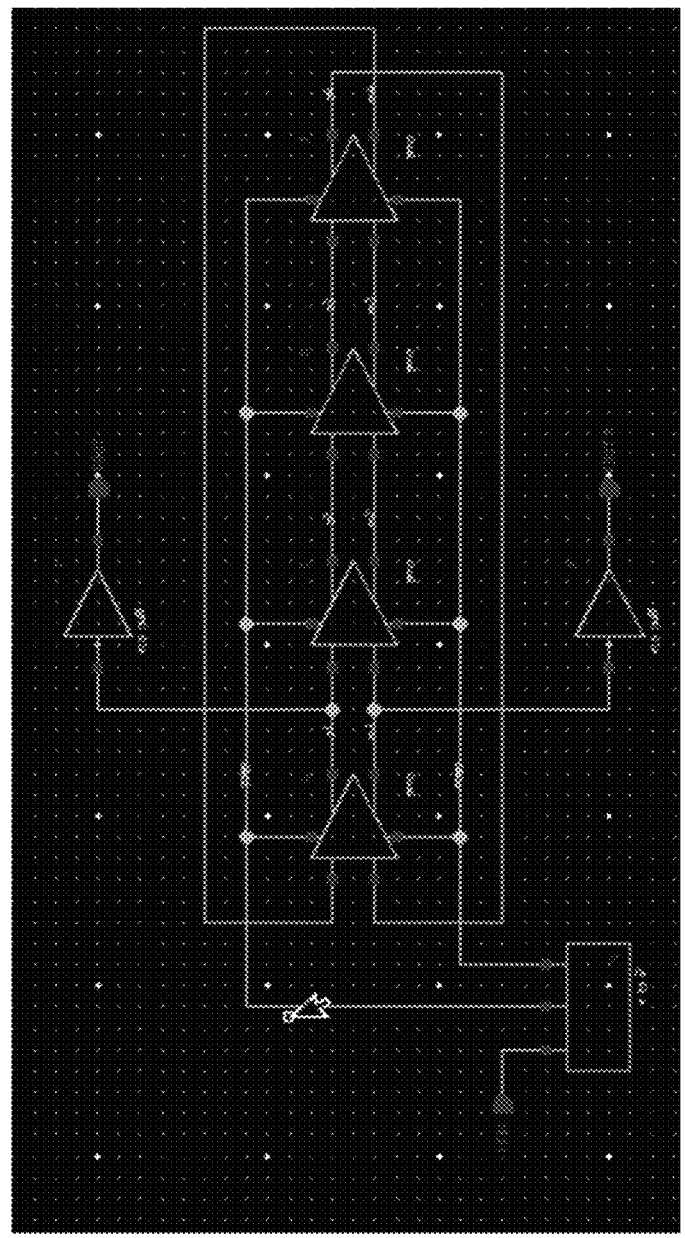
FIG. 10 shows a schematic of a Voltage Controlled Oscillator (VCO) circuit that contains multiple amplifier instances.

In either embodiment (post processing or simulator-based determination), the min/max voltage extremes for each node of the simulation hierarchy is written to a database 304 (hereinafter: the 'VDRC database' or VDRC DB). Each database record for each circuit net (circuit node) includes the min and max net voltages themselves, the hierarchical node name, and a pointer to the design cell (Library, Cell, View) in which the circuit node is encountered. In an embodiment, the VDRC database records may also contain or otherwise reference the transient waveform data during the window of interest for subsequent user inspection. Note that for hierarchical designs, the occurrence path that uniquifies each design instance's circuit node may also be present in the VDRC database records, and the 'Design' column 842 itself will typically contain more than one design, additionally often including multiple instances of the same design 844-A, 844-B, 844-C (each with a different occurrence identifier). By way of example, a Voltage Controlled Oscillator (VCO) circuit may contain multiple amplifier (e.g. 4) instances, as shown by the schematic of FIG. 10.

Figure 11:
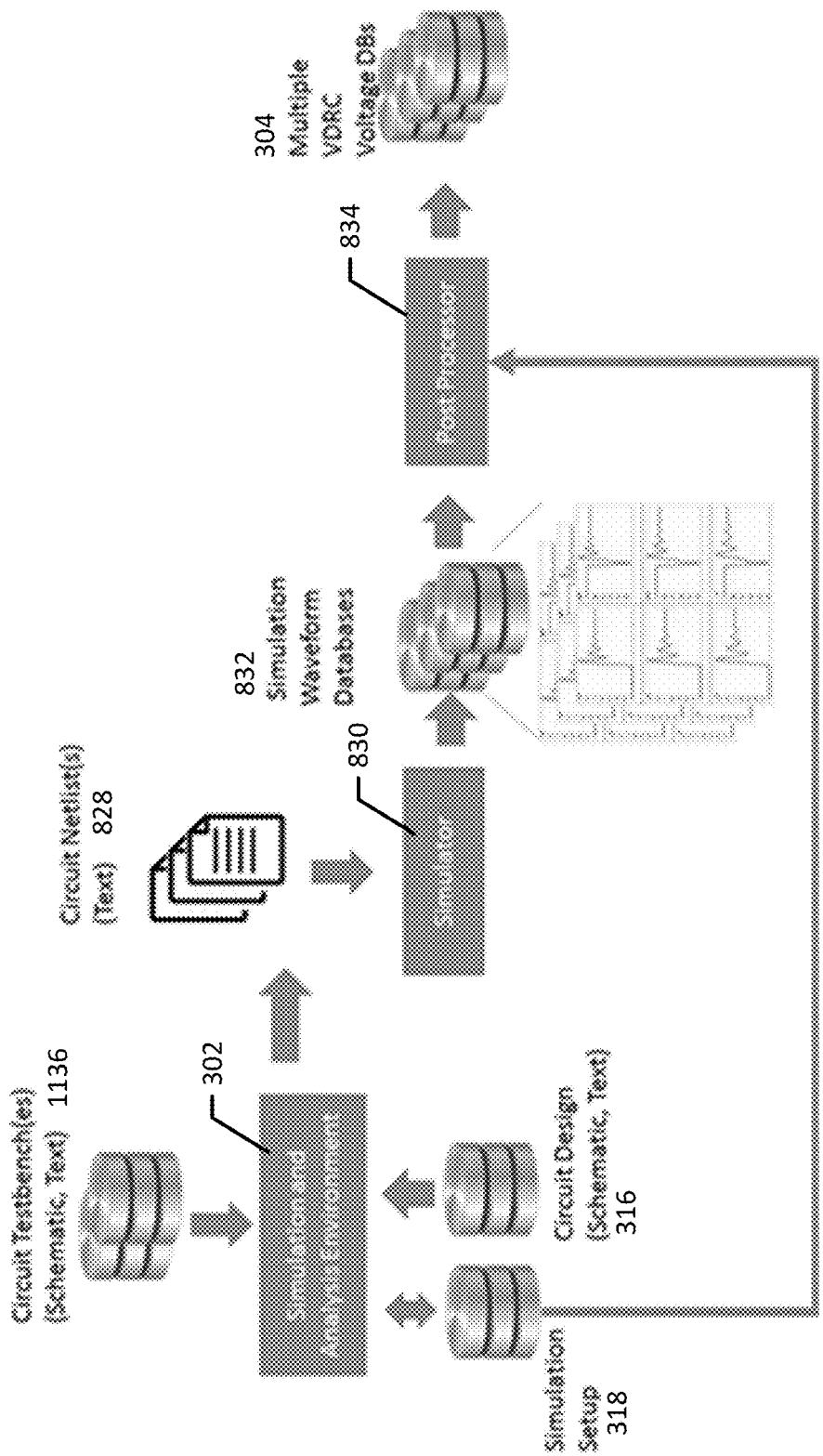
FIG. 11 shows a data flow diagram depicting an exemplary system process for performing simulator-based determination of voltage Extremes using one or more testbenches, for example, each of different process, voltage, or temperature conditions, in accordance with some exemplary embodiments of the present invention.

It is common for a circuit designer to simulate the same circuit under varying conditions, collectively referred to as PVT (Process, Voltage, Temperature) or 'corners'. The same circuit design will behave slightly differently, and produce different voltage waveforms, as a function of these variations in manufacturing processes (often represented as SPICE simulation 'corner' models such as FF, TT, SS, etc.), operating voltages, and operating temperatures. It is also common to perform simulations in conjunction with one or more testbenches 1136 (containing different inputs to stimulate the circuit under test in different operating modes, etc.) Thus, it is necessary to be able to produce different VDRC Voltage Databases 304 under each of these different conditions, leading to the more general flow as shown in FIG. 11.

The design hierarchies for each of these simulations may also be different (due to different testbench components, etc.), and the occurrence paths to the design under test (DUT) in each testbench may also vary, though the master design LCV unique identifier itself remains constant.

It is necessary to be able reconcile the various voltages values produced for each design net in these various simulations, to determine the most appropriate voltages used to guide the circuit layout. More details on this resolution/reconciliation mechanism will be presented further below.

Post-Priori Determination of Voltage Extremes Obtained from Dynamic Simulations

In the a-priori flow describe above, the user is responsible for instructing the Simulation and Analysis Environment 302 to create the VDRC Voltage Database 304 before running simulations. However, to cater to situations in which such a setup was not initially performed, but in which simulation voltage waveforms 832 are already available from previously performed simulations (user may not have used SAE 302, or may have used SAE 302 without instructing it to create the VDRC Voltage database 304), the post-priori VDRC Voltage Database creation flow is provided as an embodiment. This flow is as shown in FIG. 12.

Figure 12:
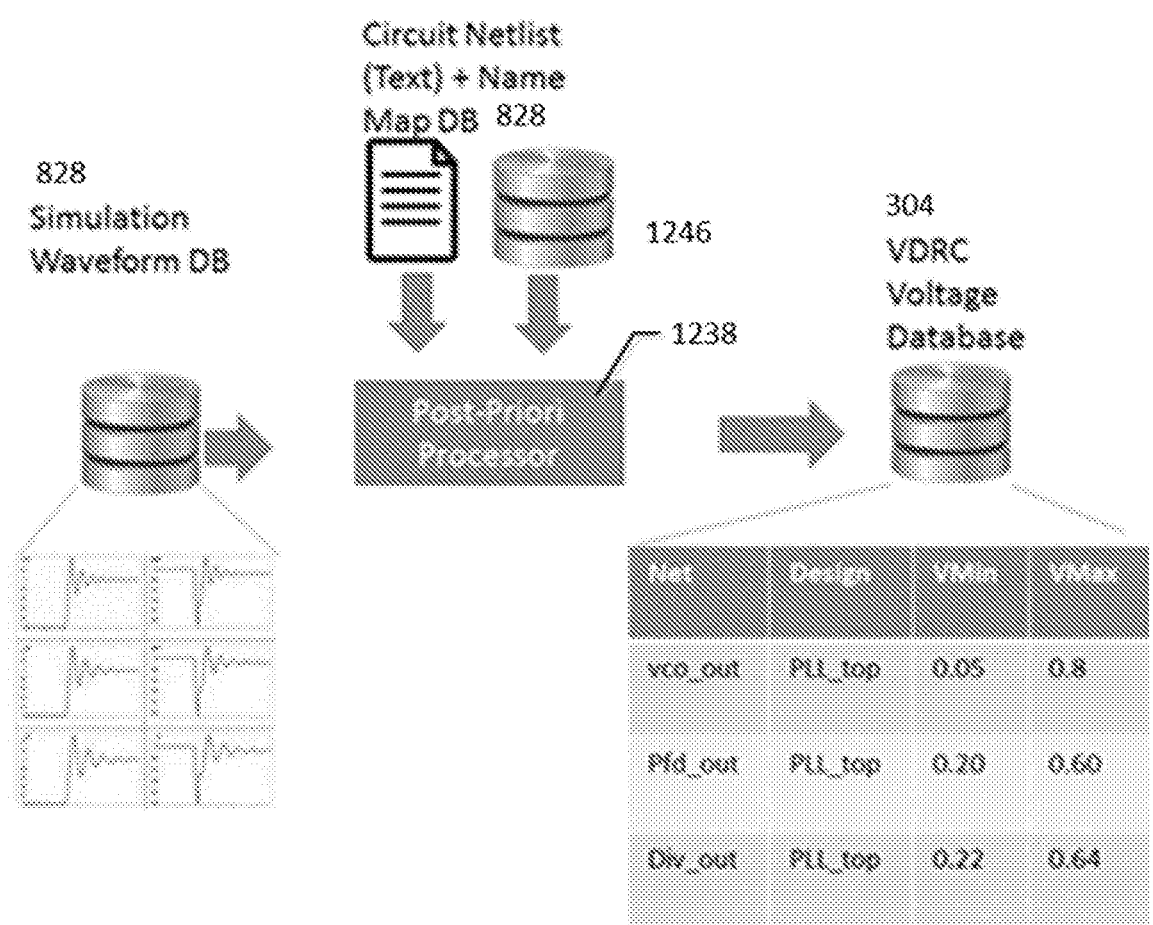
FIG. 12 shows a data flow diagram depicting an exemplary system process for performing post-priori determination of voltage extremes obtained from dynamic simulations, in accordance with some exemplary embodiments of the present invention.

FIG. 12 shows a data flow diagram depicting an exemplary system process for performing post-priori determination of voltage extremes obtained from dynamic simulations, in accordance with some exemplary embodiments of the present invention. The inputs to the flow are the Simulation Waveform Database 832, the Circuit Netlist File 828, and the Name Map directory 1246 containing a mapping from the circuit schematic namespace to the circuit simulation (SPICE Netlist) name space. The name mapping information 1246 is used to correlate the names in the simulator output database 832 with the original names in the circuit schematic, as the schematic names will be used later when visualizing or overriding the VDRC Voltage database 304 values. In some embodiments, the name mapping information may also be stored or referenced within the VDRC Voltage database itself.

Figure 13:
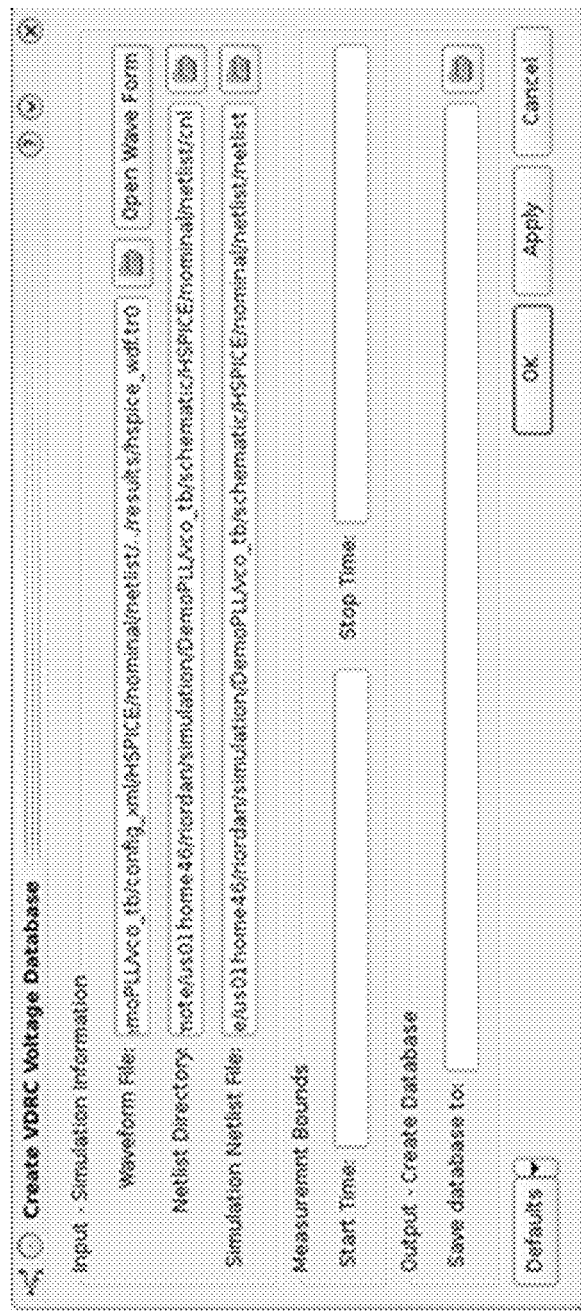
FIG. 13 shows a graphical user interface depicting various fields in which the user inputs can be entered, in accordance with some exemplary embodiments of the present invention.

A GUI showing the fields in which the user inputs can be entered is shown in FIG. 13. The top of the GUI form shows the three primary inputs. This flow additionally allows the user to specify a time window, in addition to the name of the output database to be created. In some embodiments, additional fields may be present to accept further user inputs to filter voltage 'spikes' e.g. a field for entering the period for a moving average filter.

Incorporating/Resolving the Results of Multiple Dynamic Simulations

Figure 14:
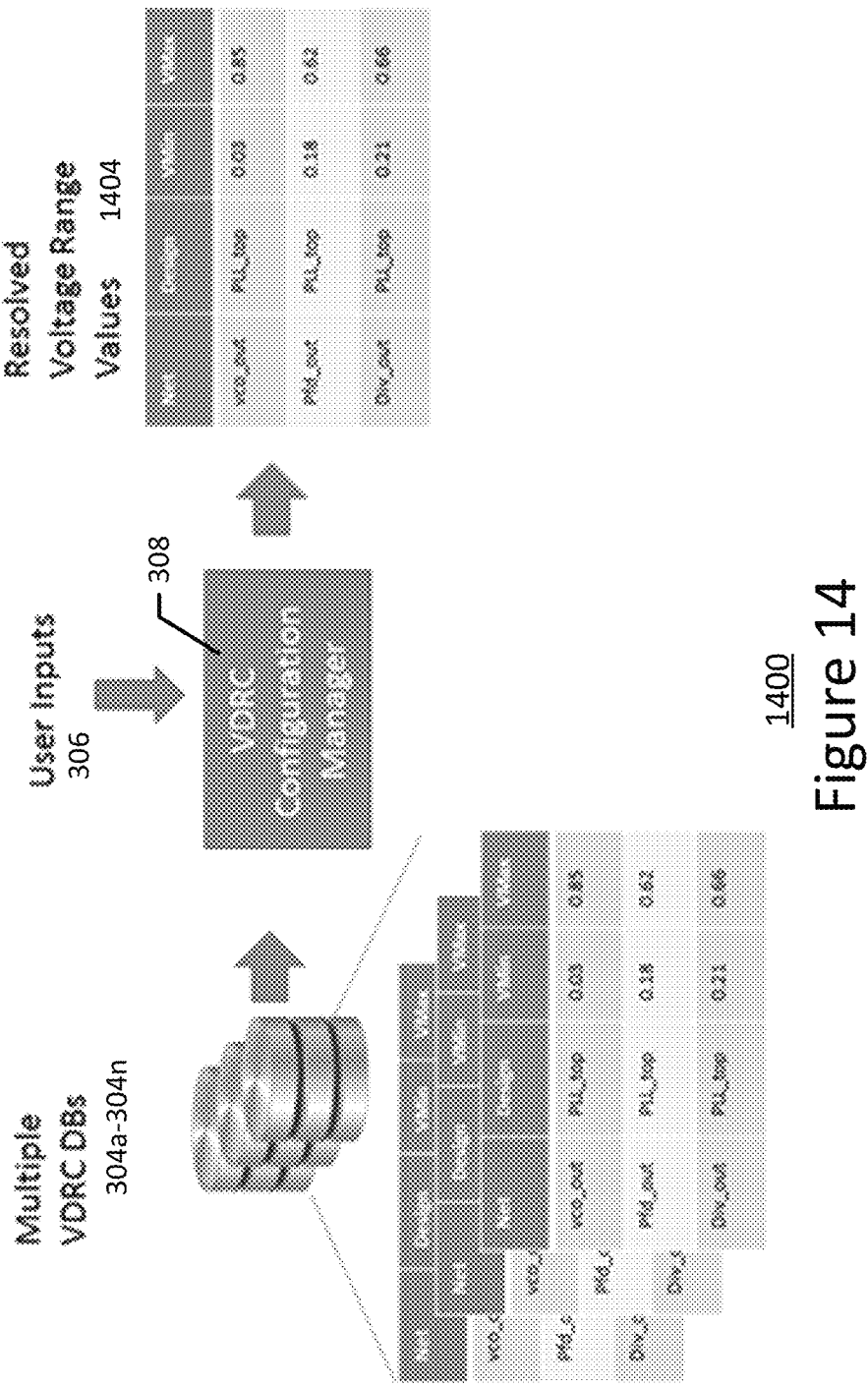
FIG. 14 shows a data flow diagram depicting an exemplary system process for performing a process of resolving or reconciling multiple VDRC databases, in accordance with some exemplary embodiments of the present invention.

As stated above, there may be multiple simulations performed under various PVT conditions, and/or multiple testbenches/stimulus conditions and/or circuit operating modes. In some embodiments, individual VDRC Voltage Databases 304 may be created for each of these conditions. A resolution or reconciliation mechanism implemented within the VDRC Configuration Manager 308 allows a user to control how these various voltage databases and their constituent voltage values are to be handled when visualizing or overriding net voltage range values. The data flow diagram illustrating this process is shown in FIG. 14. That is, FIG. 14 shows a data flow diagram depicting an exemplary system process for performing a process of resolving or reconciling multiple VDRC databases 304, in accordance with some exemplary embodiments of the present invention. The reconciled or resolved voltage range values 1404 which are output by this process are then visualized within the schematic and/or fed to the layout and verification (collectively referred to as 'back-end') tools 312, 320, 322, 324.

Three primary reconciliation choices are offered to the user when multiple VDRC database exist, including (i) Take the 'worst case' values across all VDRC Databases. For each circuit node, the minimum value of all the individual minimum values (encountered in the various VDRC databases under the various conditions) is determined, and the maximum value of all the maximum values is determined. These global min/max values are then used as the resolved 'simulated' minimum and maximum values or range values for each net; (ii) Take the min/max values from a single VDRC Database. This allows a user to select one of the multiple VDRC databases as being 'representative' of all the others. The user designates which of the multiple databases to use. These specific database min/max values are then used as the resolved 'simulated' minimum and maximum values or range values for each net; or (iii) Take the min/max values from a group of VDRC Databases. Here, the user designates a subset (one or more) of the VDRC databases to use, and the minimum value of all the individual minimum values (encountered in the various databases comprising the subset) is determined, and the maximum value of all the maximum values in the subset is determined. These subset-aggregated min/max values are then used as the resolved 'simulated' minimum and maximum values or range values for each net.

Figure 15:
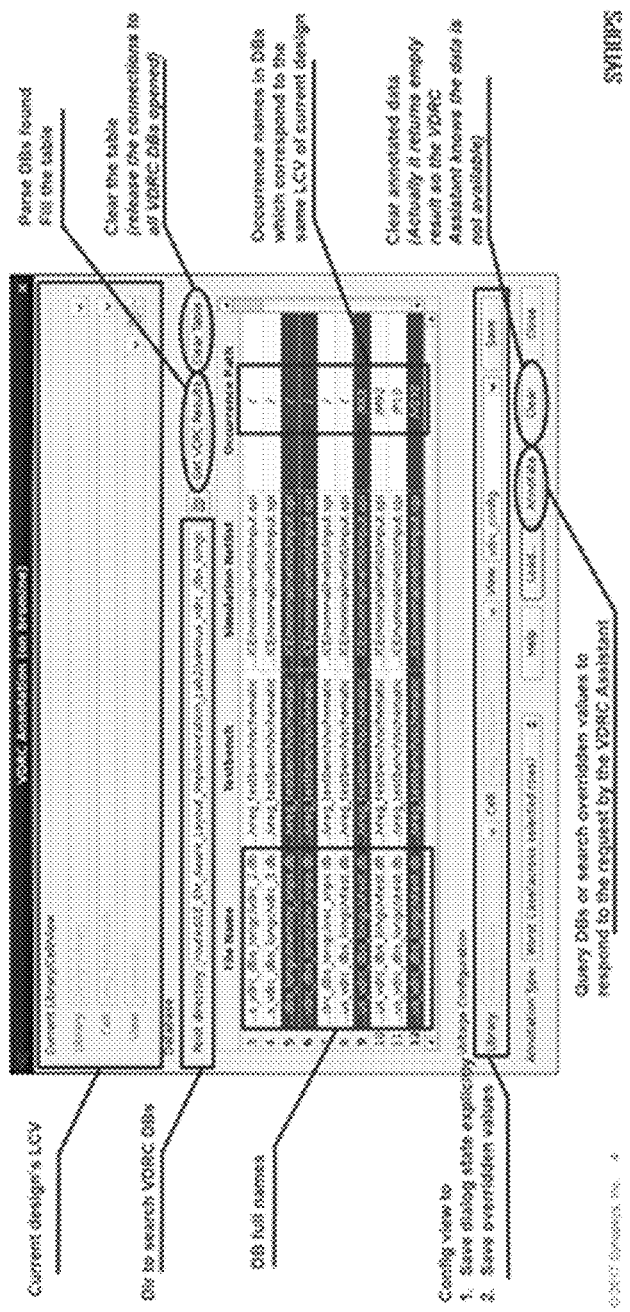
FIG. 15 shows a VDRC Configuration Manager GUI configure to allow the user to specify inputs to control the reconciliation process, in accordance with some exemplary embodiments of the present invention.

FIG. 15 shows a VDRC Configuration Manager GUI configure to allow the user to specify inputs to control the reconciliation process, in accordance with some exemplary embodiments of the present invention. The top of the GUI shows the LCV (Library, Cell, View) information for the design under consideration, and the 'Get VDRC Results' button queries the user's simulation results directory hierarchy to identify the relevant VDRC databases. Any VDRC database with at least one 'Design' record entry that matches the given LCV design is then considered and added to a table. User controls allow the user to specify the 'Annotation Type' which is the primary mechanism for specifying which of the three resolution mechanisms above is to be used to resolve conflicting values when multiple matching VDRC databases are found. The Annotation Type widget (near the bottom of the dialog), allows the user to pick from one of three dropdown choices. The 'Annotate' button is then used to visualize the corresponding Net voltage range values in conjunction with the circuit schematic.

Figure 16:
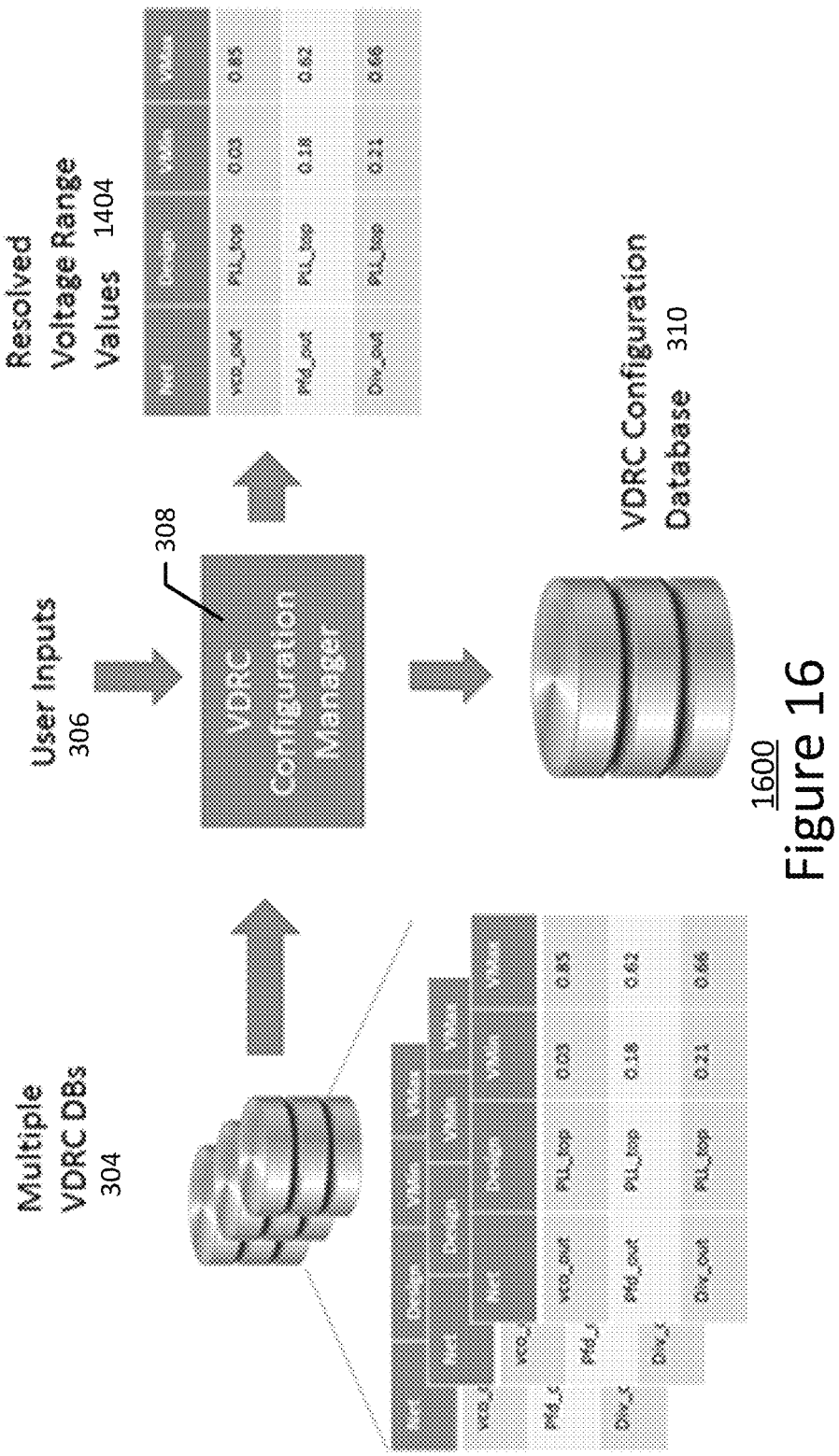
FIG. 16 shows a data flow diagram depicting an exemplary system process for performing a process of enabling the persistence of preferences for resolving the results of multiple dynamic simulations, in accordance with some exemplary embodiments of the present invention.

Persisting of Preferences for Resolving the Results of Multiple Dynamic Simulations FIG. 16 shows a data flow diagram depicting an exemplary system process for performing a process of enabling the persistence of preferences for resolving the results of multiple dynamic simulations, in accordance with some exemplary embodiments of the present invention. The 'Save' button of the 'Voltage Configuration' field may be utilized to save (persist) the information in the dialog of FIG. 15 to a database 310 within a user-specified Library/Cell/View container (a so-called VDRC 'config' view), as shown in FIG. 16. In an embodiment, the corresponding information may be stored in an XML format, or alternate formats may also be used. In an embodiment, the information stored includes the user inputs such as the list of selected VDRC Databases 304 and the Annotation Type. In an embodiment, the information in the one or more selected VDRC Databases 304 selected by the user is copied into a special partition within the VDRC Configuration Database 310. In this case, the original VDRC databases 304 may now be deleted after the VDRC Configuration Database 310 has been created, and/or the VDRC Configuration Database 310 may be shared with other designers/layout engineers in different geographical zones where the file network paths to the original VDRC Databases 304 may not exist or be resolvable. In an alternative embodiment, absolute or relative paths to the selected VDRC databases 304 may be referenced from within the VDRC Configuration database 310, rather than copying the information.

Visualizing of Net Voltage Ranges in Circuit Schematic Environment

Figure 17:
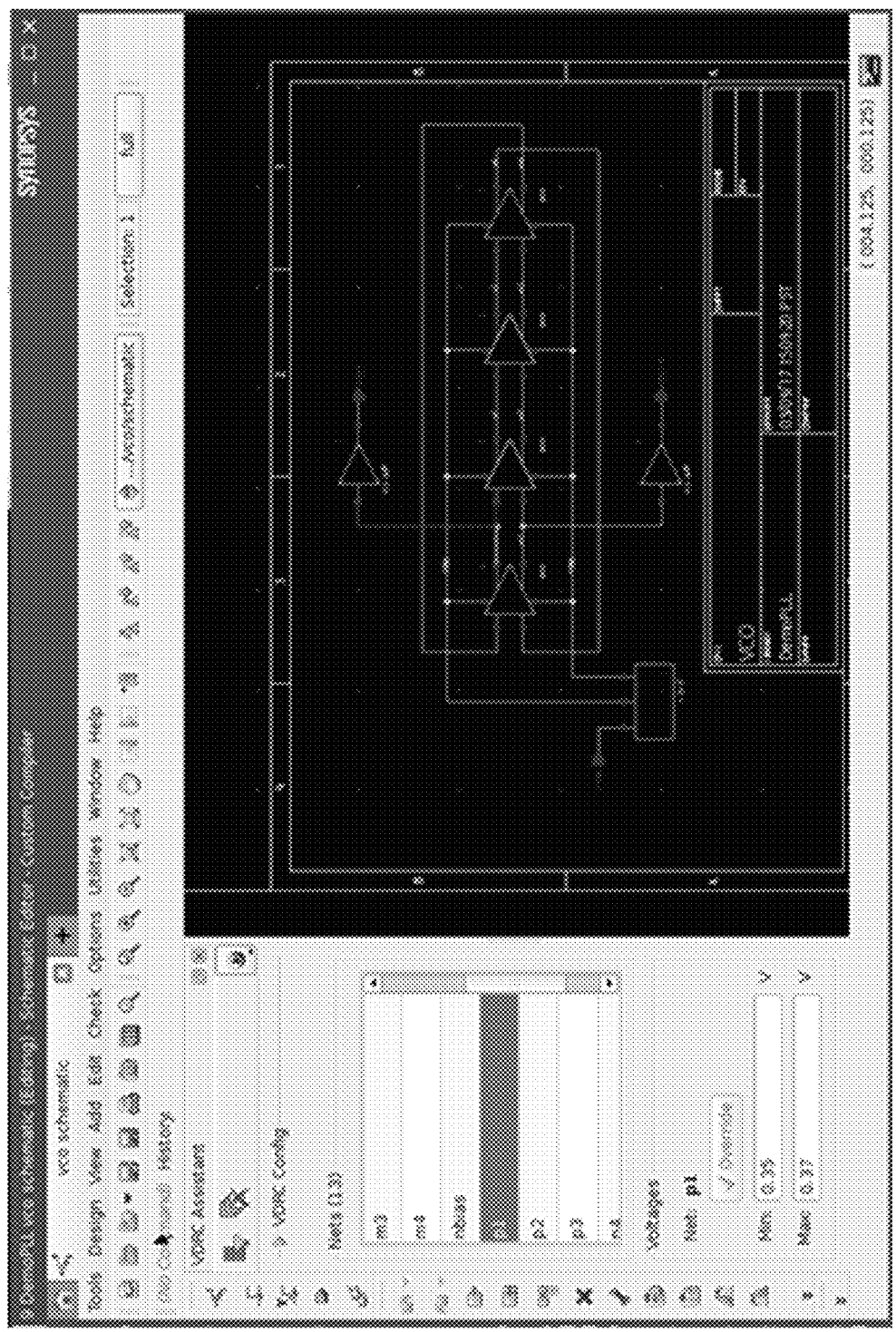
FIG. 17 shows a user interface depicting a Schematic Editor and a docked VDRC Assistant window.

FIG. 17 shows a user interface depicting a schematic editor and a docked VDRC Assistant window. Net voltage range values may be visualized in the circuit schematic editor via several means including textual annotations on the nets in the schematic canvas a VDRC 'Assistant' as shown in FIG. 17 both textual annotation and VDRC Assistant.

In some embodiments, the VDRC Assistant operates in conjunction with the schematic editor to show the voltage range values on selected nets. A table in the VDRC assistant enumerates the nets in the design schematic, and allows a net to be selected via a mouse click within the table. The selected net is also cross-selected within the schematic canvas. In an embodiment, the user may also click on a net, or any object directly connected to a net (such as a terminal, or instance terminal, or net label) within the schematic canvas, and the corresponding net is identified and correspondingly cross-selected within the VDRC assistant. FIG. 17 shows how the user has selected a net 'p1' within the VDRC Assistant, which is highlighted in red in the schematic canvas. Below the net table in the VDRC Assistant is a 'Voltages' section which shows the name of the currently selected net, and its annotated minimum and maximum voltage values.

Overriding Net Voltage Ranges in Circuit Schematic Environment

Figure 18:
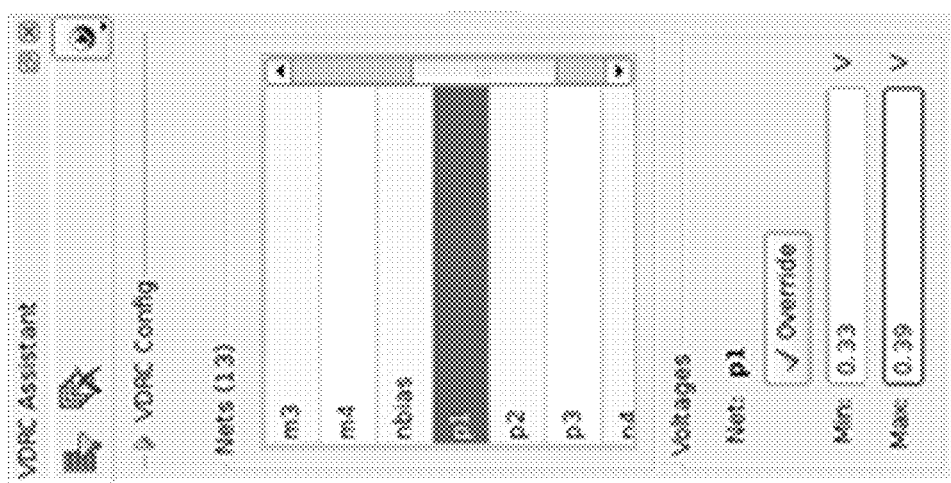
FIG. 18 shows a user interface configured to enable overriding net voltage ranges in circuit schematic environment.

FIG. 18 shows a user interface configured to enable overriding net voltage ranges in circuit schematic environment. The voltage values in the min/max fields may be edited by the Circuit Designer (the 'Override' button is enabled in response), and the changed values may be committed by clicking the Override button, as shown in FIG. 18.

This voltage range override scheme allows the Circuit Designer to override the values determined by the VDRC Configuration manager 308 based on its reading of the VDRC Voltage Database(s) 304 produced via simulation. The Circuit Designer may use his/her design knowledge to provide the updated values. In an IP-reuse situation, the Circuit Designer may override any VDRC Voltage Database 304 values provided by the IP provider with a more context-aware (in terms of the IP reuse context) set of values. For example, the Circuit Designer may be re-using the IP in a circuit designer with larger or smaller voltage values than used when the original IP was designed.

To aid the designer in dealing with large numbers of nets in large designs, various filtering options are offered. In an embodiment, a designer may filter nets based on net names, by entering a pattern, such as a regular expression. Names which partially or completely match that pattern are displayed in the table of FIG. 18, the other nets being removed. In an alternate embodiment, the filtering may be performed based on voltage range values. The designer enters voltage range values, and needs which exceed those voltage ranges are displayed in the table, the other nets being removed. In an embodiment, both filtering operations may be combined simultaneously.

To aid the designer in understanding which nets values have been overridden, an embodiment may cause the display the net names for overridden nets with a different visual presentation (e.g. a font change such as italic font) and/or annotate the min/max labels themselves (e.g. the presence of an asterisk in the Min/Max labels themselves).

In an embodiment (as per FIG. 4 and FIG. 5), there may be no dynamic simulation determined net voltages at all (e.g. the VDRC Voltage databases 304 may be entirely missing, or empty), and the min/max fields may still be used to specify values for such nets.

Figure 19:
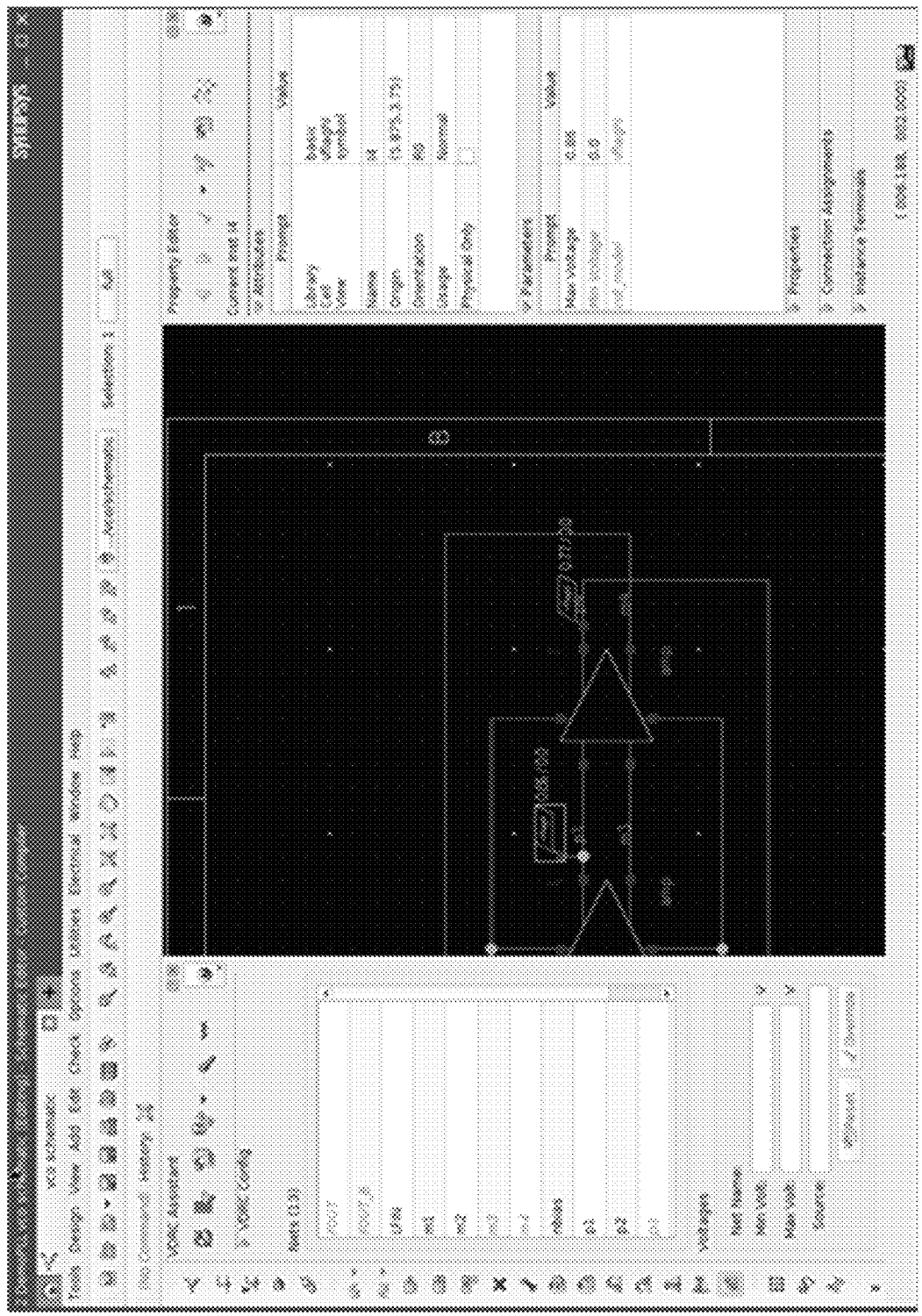
FIG. 19 shows a user interface configure to allow editing of a VFlagHL instance in a schematic, and in particular, depicting a Circuit Schematic Canvas and an invoked dialog box allowing the user to specify min/max values, or direct editing of min/max voltage labels.

Graphical (On-Canvas) Method for Overriding Net Voltage Ranges in Circuit Schematic Environment In some embodiments, net voltage ranges may also be overridden within the Circuit Schematic Canvas. A context menu choice for nets in the schematic canvas may be used to invoke a dialog allowing the user to specify min/max values, or direct editing of min/max voltage labels themselves displayed on the canvas may also be employed. FIG. 19 shows a user interface configure to allow editing of a VFlagHL instance in a schematic, and in particular, depicting a Circuit Schematic Canvas and an invoked dialog box allowing the user to specify min/max values, or direct editing of min/max voltage labels. In an alternative embodiment, symbols such as a VFlagHL may be attached to schematic nets within the schematic canvas, the symbols themselves selectable, and the voltage min/max values overridden as symbol properties using the standard Property Editor available in the tool. As shown in FIG. 19, where the selected Vflag instance (parallegram symbol) is highlighted in yellow in the schematic canvas, its properties may be edited in the Property Editor on the right. In such a case, a synchronization mechanism may be employed to synchronize the properties on the symbols with those in the VDRC Configuration database 310, and vice versa, using the net associated with each specific symbol instance.

Figure 20:
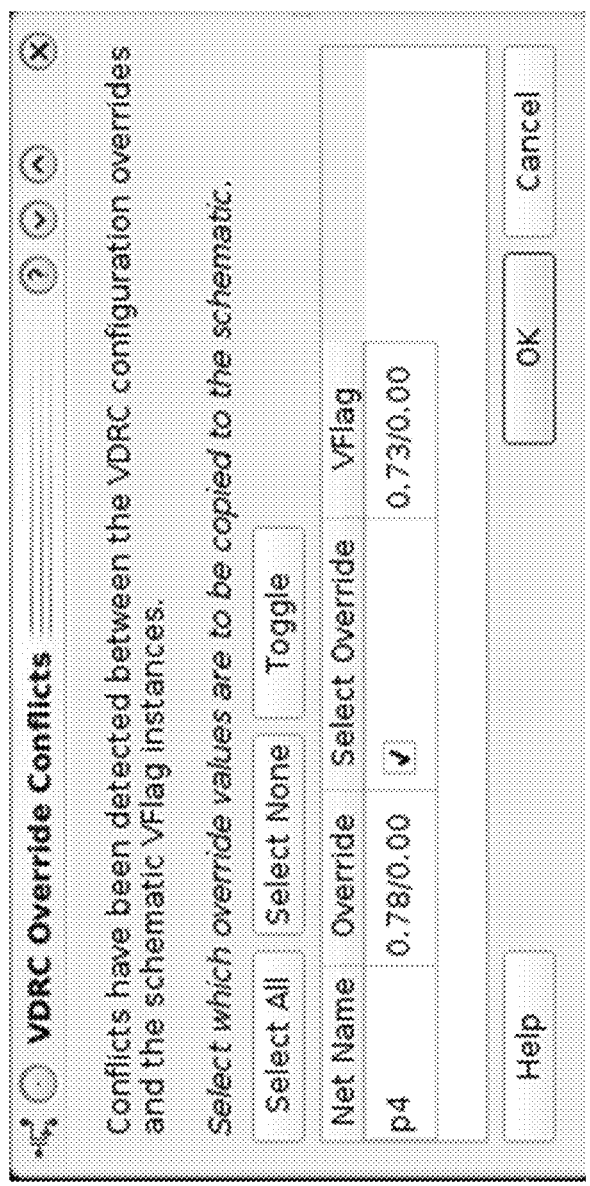
FIG. 20 shows a screenshot of a conflication resolution dialog box.

A graphical user interface enabling the synchronization of both the VDRC Configuration Database 310 and the Schematic Database 316 with Vflag instances is as show in FIG. 19. When conflicts are detected between the two information sources, a conflict resolution dialog (see FIG. 20, which shows a screenshot of a conflication resolution dialog box) allows the user to determine how to deal with them, selecting whether to propagate the conflicting values from once source to the other.

Persistence of Net Voltage Range Overrides

Figure 21:
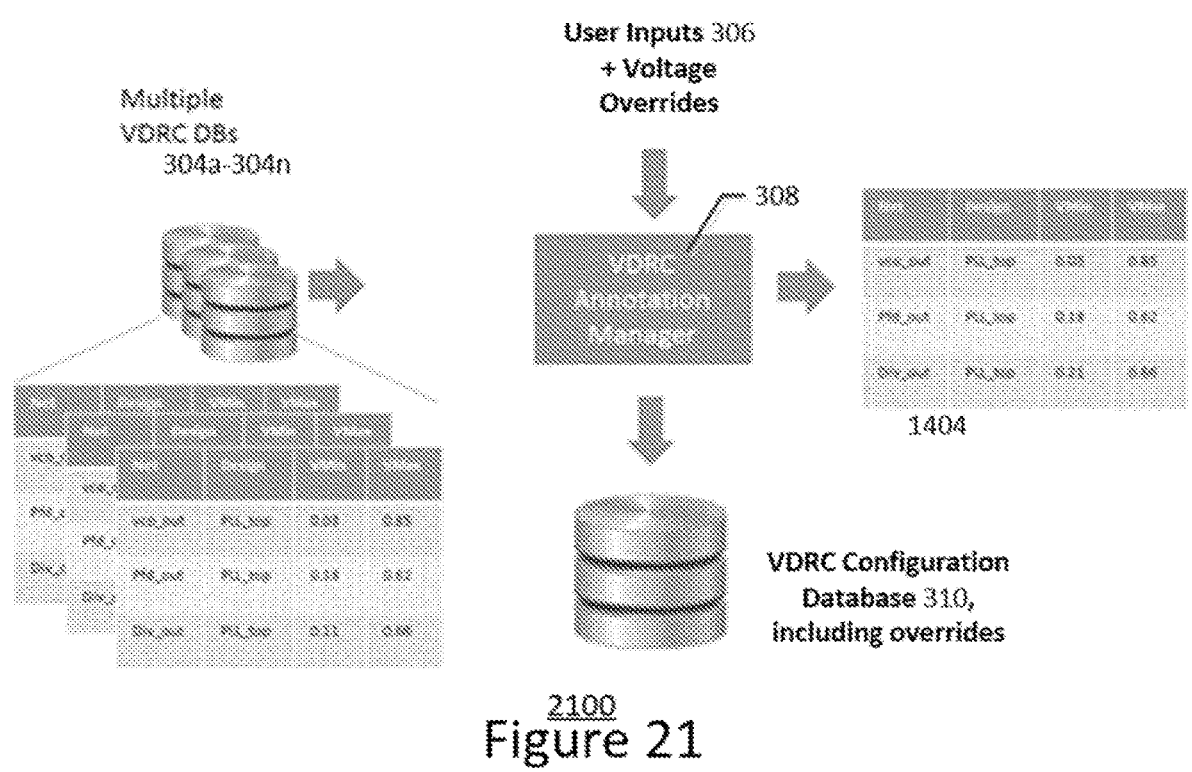
FIG. 21 shows a data flow diagram depicting an exemplary system process for performing a process enabling the persistence of net voltage range overrides by saving voltage overrides to VDRC configuration database, in accordance with some exemplary embodiments of the present invention.

In some embodiments, the voltage range overridden values are persisted to a partition within the Voltage Configuration Database 310 maintained by the VDRC Configuration manager 308, as shown in FIG. 21. FIG. 21 shows a data flow diagram depicting an exemplary system process for performing a process enabling the persistence of net voltage range overrides by saving voltage overrides to VDRC configuration database 310, in accordance with some exemplary embodiments of the present invention.

Handling Conflicts in Hierarchical Design Situations

In hierarchical design environments, it is common for nets to traverse several levels of design hierarchy. In such a case, it is possible for simulated net VDRC Voltage range values to be specified for design cells at any level of the hierarchy, or for the VDRC override values to be specified at any level of the design hierarchy. In such a case, for any net that electrically traverses hierarchical levels, the net values or overrides determined at the highest level of the design hierarchy is chosen to avoid conflicts, and appropriate warnings are generated informing the user of the lower-level hierarchical net voltage values or overrides which are being ignored. In an embodiment, conflicts may be resolved using a mechanism such as just described, and the user presented with warnings. In an alternative embodiment, errors may be generated instead, and the user required to manually resolve any conflicts e.g. via editing of the overrides at each level of the hierarchy.

Comparing ECO-Induced Voltage Changes with Saved Configuration Values

It may be the case that an IP, for which voltage ranges have been saved, is used in a new design context in which different voltages apply. It may also be the case that after a VDRC Configuration database 310 has been deemed as 'finalized', and layout has been fully or partially completed taking those voltage ranges and their corresponding spacing's into account, that late coming Engineering Change Order (ECO) changes are introduced. Such changes may lead to voltage value changes and render the previously completed layout incorrect with respect to the new voltages and their requisite spacing's. As such, after simulating such a new design context or ECO change, it is useful to be able to compare the observed simulated voltage ranges with the voltage ranges previously specified in the VDRC Configuration Database 310, to see if the newly simulated voltages are consistent with the values in the Configuration Database 310. An embodiment allows simulation assertion statements to be created during netlisting or netlisting assembly that causes the simulator to perform such checks and comparisons automatically. Any such violations are detected, and the appropriate warnings (or, in an embodiment, errors) presented to the user 326. User actions in response may be to create new override values, or to re-create the layout with more appropriate spacing's, or some combination of the two.

Automatic Transfer of Voltage Range Information to Schematic Driven Layout

In Schematic Driven Layout (SDL) environments, an embodiment allows the voltage range information in the VDRC Configuration Database 310 to be propagated as attributes on the Open Access (OA) nets in the layout. This synchronization happens whenever a new SDL session is initialized. In an embodiment, an explicit user-initiated synchronization step may also be used to achieve the same goals. Here, a toolbar icon in the VDRC Assistant for example may be used to initiation the synchronization step (a 'push' mechanism from schematic to layout). In an embodiment, a 'pull' mechanism may also be deployed in which a GUI icon is provided in the SDL tool (Layout Editor) to enable the use to request the same information. In this case, the VDRC Configuration database 310 is consulted to determine the net voltage ranges (with any overrides accounted for), and the resulting resolved values are copied into the OA net attributes within the layout.

Figure 22:
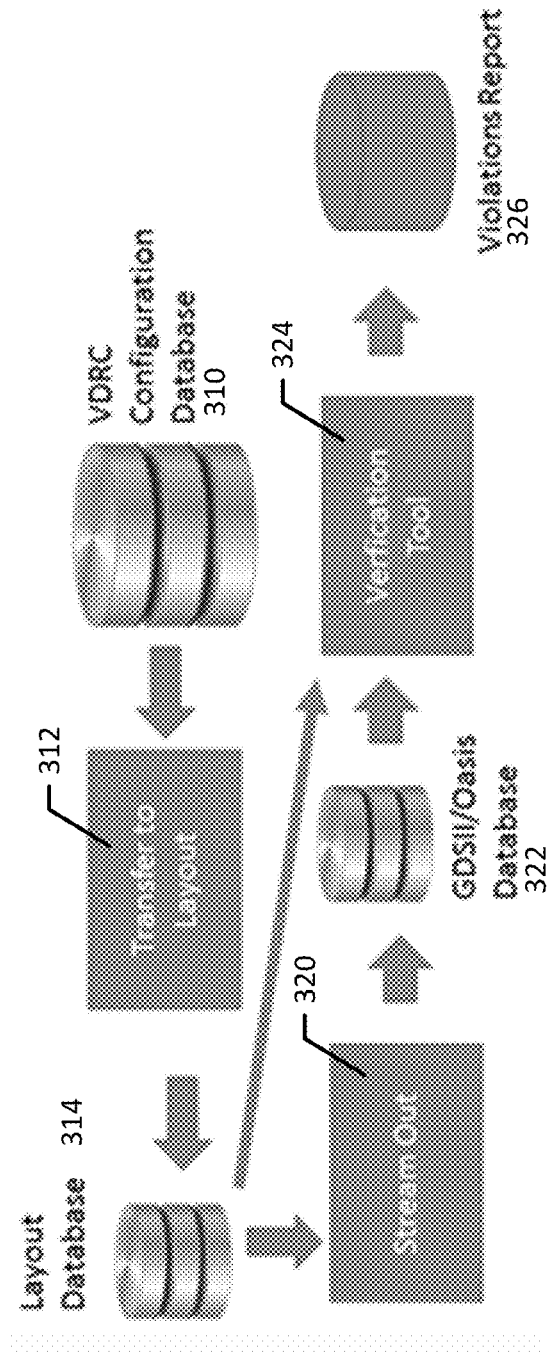
FIG. 22 shows a data flow diagram depicting an exemplary system process for performing an automatic transfer of voltage range information to schematic driven layout.

FIG. 22 shows a data flow diagram depicting an exemplary system process for performing an automatic transfer of voltage range information to schematic driven layout.

When the layout is saved, the voltage range values are persisted to the OA Database 314. This automatic or user-initiated transfer step allows for the 'freezing' of the net voltage ranges into the layout database 314 itself. The frozen net voltage values are then used in the downstream tools 324 that perform the actual verification of the layout database.

Figure 23:
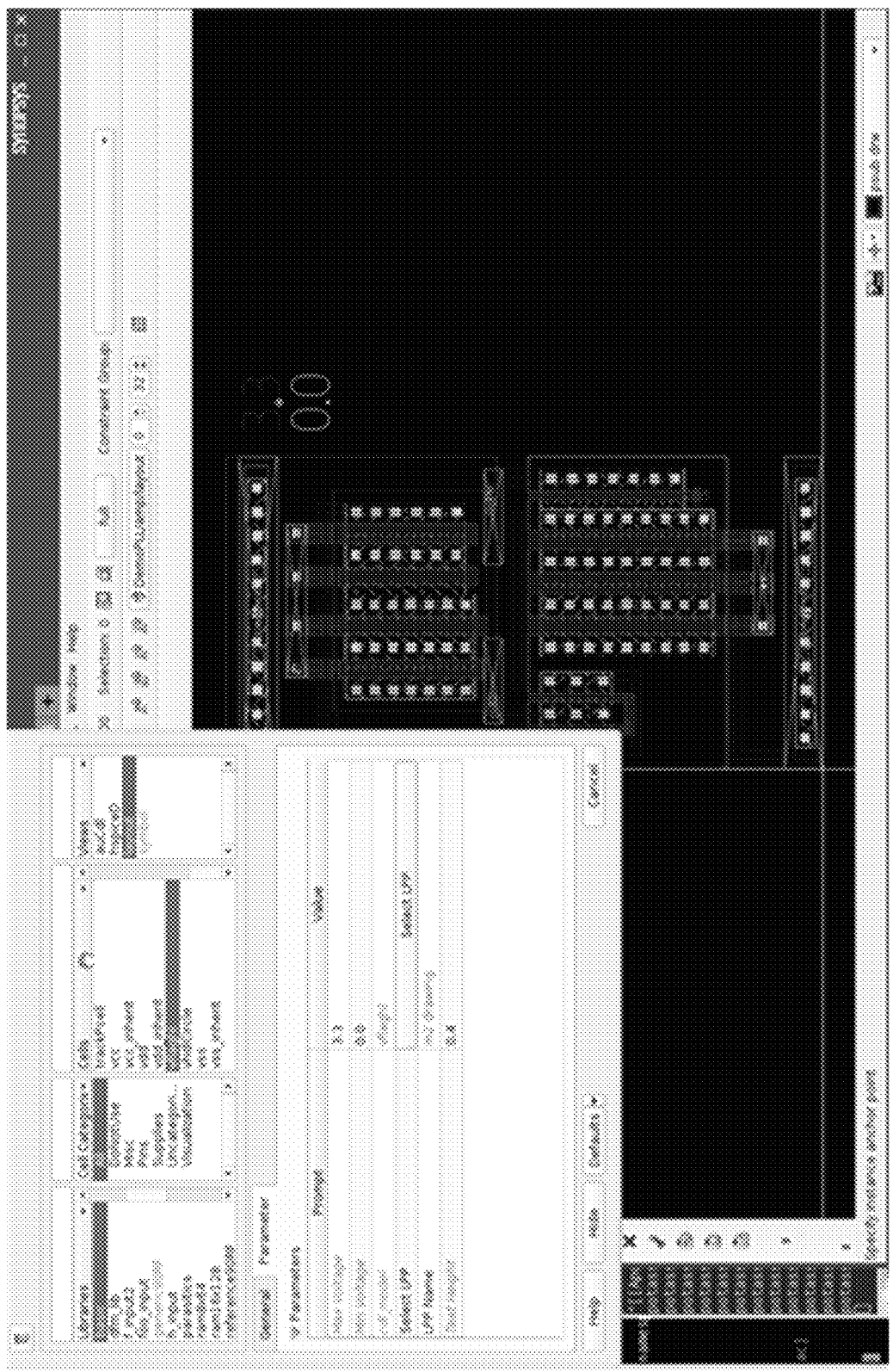
FIG. 23 shows a user interface configured to enable the instantiating of a VflagHL cell directly in a layout.

Specification of Voltage Range Information in Non-Schematic-Driven-Layout Scenarios The transfer of VDRC Configuration schematic level voltage information from Schematics to Layout in Schematic-Driven-Layout (SDL) flows via VDRC Configuration database 310 is enabled by the full correspondence information maintained during SDL. By this, the SDL 'session' is aware of what nets and instances in the schematic correspond to what nets and instances in the layout. For those performing layout without such a correspondence, using a non-SDL flow, another embodiment is provided. This embodiment provides a mechanism for entering voltage level information directly in the layout database itself, via the instantiation of a special cell. This is illustrated via the screenshot of FIG. 23. Here, the user is directly instantiating a programmable layout cell which contains two voltage levels (3.3 and 0.0) volts specified as labels on specific layer-purpose pairs (m2-drawing in this example). This approach allows the user to directly specify the voltages in a form that the downstream Verification tools 324 can understand, by direct label values on specific levels/purposes known to the Verification tools 324.

Automatic Use of Voltage Range Information During Layout Editing Operations

In an embodiment, voltage range information may be used by the layout editor prior to final verification. Examples include 'LiveDRD', a design-rule-driven feature in which the user is dynamically notified of design rule violations while interactively performing edits such as routing nets, moving or stretching polygons associated with nets, etc. When LiveDRD takes VRDC related spacing into account, the user is instantly notified of any VDRC violations introduced while performing the editing. In an embodiment, the layout tool may prevent the user from making any edits to nets that would result in a VDRC-related spacing violation. In such embodiments, the VDRC Configuration Database 310 is dynamically consulted during each editing step in order to determine the voltage range information for the net currently being edited, along with the voltage information for any nets which are running nearby (these may be determined by an appropriate region query to the layout design database itself), the voltage delta's are computed, and the process-dependent spacing rules in the technology database are also consulted to determine if any violations are being introduced. Warnings or Errors are issued as appropriate 326.

In an embodiment, the VDRC Configuration information and the spacing rules in the DRM may also be considered by automation tools such as Placement and Routing tools. With this knowledge at their disposal, the tools can be configured to generate placement and routing solutions that will minimize or eliminate any VDRC spacing violations that would lead to eventual rework. In order to do so, these tools may determine the voltage ranges on nets being routed, and any other nets in the vicinity, calculate the voltage deltas (see FIG. 1), and ensure the nets are sufficiently spaced to avoid any VDRC violations. Placement tools may place instances sufficiently far apart (i.e. create wide enough routing channels) to ensure necessary VDRC spacing's can be implemented by subsequent routing steps in the flow, and may be further optimized to avoid creating routing channels that are pessimistically wide (and wasteful of area).

Use of Voltage Range Information by Integrated Verification Tools

In an embodiment, integrated verification tools 324 such as ICV (IC-Validator from Synopsys) can read the design layout information directly. Such verification tools 324 read the frozen net voltage attributes from the OA net objects within the design via the appropriate OA API. For adjacent nets, (or pairs of nets which have otherwise been identified to be considered for Voltage-based rule checking), the corresponding voltage deltas are computed, the technology file consulted to determine the related spacing rules, and any violations are detected by the verification tool 324. The verification tool 324 outputs the violation information to its log file, and/or issues error markers into the layout design itself.

Export of Voltage Range Information to Third Party Verification Tools

Figure 24:
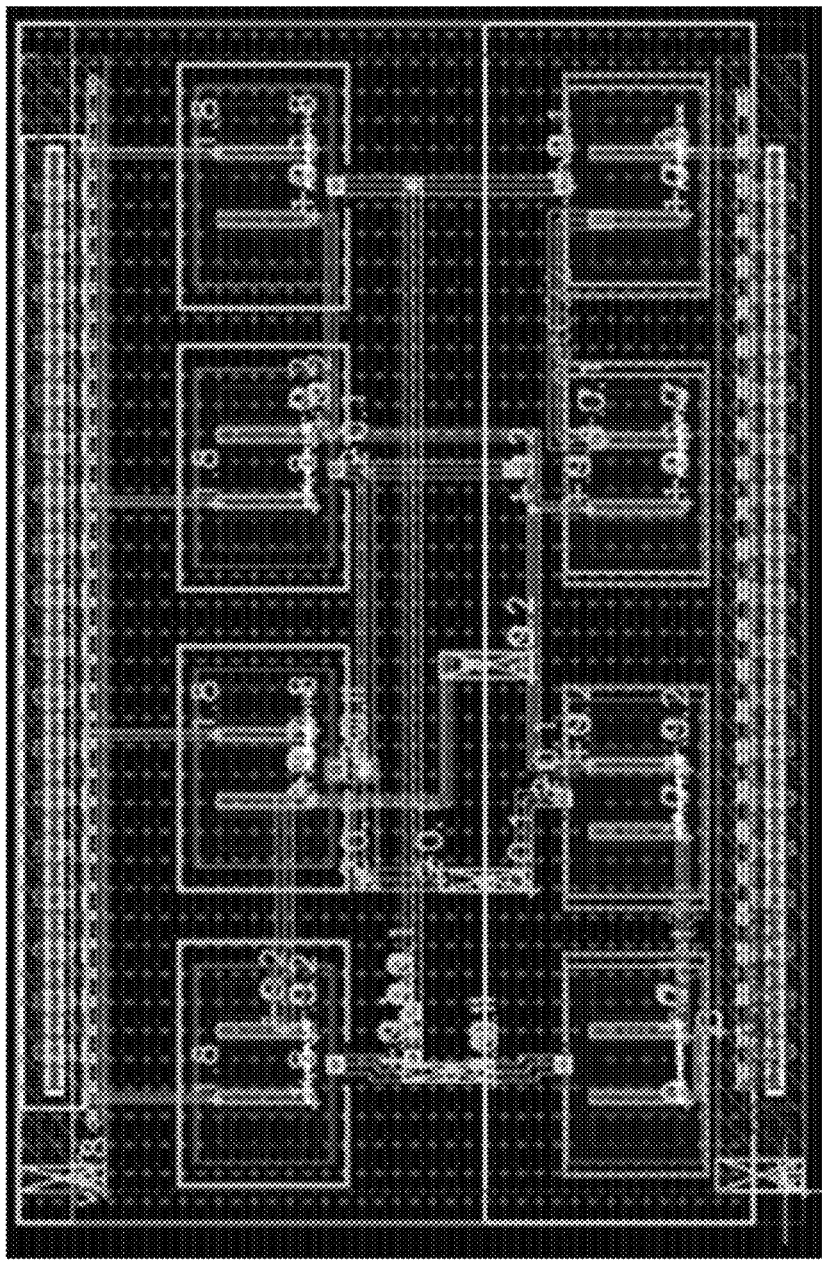
FIG. 24 shows a user interface depicting a layout containing Voltage Range Marker Labels.

In an embodiment, Voltage Marker Labels may be annotated onto the layout, and included with the design information when it is streamed out to non-OA formats such as GDSII and Oasis (Open Artwork System Interchange Format). The data flow diagram is as shown in the bottom portion of FIG. 22. These labels are annotated as marker objects on specially identified layers within the design, as shown for example in FIG. 24.

Geometric locations are chosen for these label objects such that they clearly identify to which nets to which they pertain, and an agreed-upon format is chosen in which the voltage range information (min, max values) is encoded. The format itself may dependent upon the Verification Tool 324 to be used (e.g. ICV may use one format, Mentor Graphics' Calibre DRC another) and/or the Foundry used for manufacturing the circuit. The exported database 322 is then read by the verification tool 324, the net voltage ranges determined by decoding the streamed-out marker objects, the voltage deltas then computed for adjacent nets (see FIG. 1), the DRM rules are consulted to determine the requisite spacing's, and any violations are flagged by the Verification Tool 324. Integrations of the verification tools within the design and layout environment can then be leveraged to present the violations 326 in a standard manner familiar to layout engineers.

DETAILED DESCRIPTION—TECHNOLOGY SUPPORT

General Computer Explanation

FIGS. 26A, 26B and 26C are simplified block diagrams of a computer system suitable for use with embodiments of the technology, as well as circuit design and circuit embodiments of the technology.

In FIG. 26A, computer system 2610 typically includes at least one computer or processor 2614 which communicates with a number of peripheral devices via bus subsystem 2612. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 2624, comprising a memory subsystem 2626 and a file storage subsystem 2628, user interface input devices 2622, user interface output devices 2620, and a network interface subsystem 2616. The input and output devices allow user interaction with computer system 2610.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions (sequential or otherwise) that specify actions to be taken by that machine.

The computer system 2610 typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi processor or multi-core system and may use or be implemented in a distributed or remote system. The term 'processor' here is used in the broadest sense to include a singular processor and multi-core or multi processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 2610 depicted in FIG. 26A is intended only as one example for purposes of illustrating the preferred embodiments. Many other configurations of computer system 2610 are possible having more or less components than the computer system depicted in FIG. 26A.

Network interface subsystem 2616 provides an interface to outside networks, including an interface to communication network 2618, and is coupled via communication network 2618 to corresponding interface devices in other computer systems or machines. Communication network 2618 may comprise many interconnected computer systems, machines and communication links. These communication links may be wireline links, optical links, wireless links, or any other devices for communication of information. Communication network 2618 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 2622 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 2610 or onto communication network 2618. User interface input devices typically allow a user to select objects, icons, text and the like that appear on some types of user interface output devices, for example, a display subsystem.

User interface output devices 2620 may include a display subsystem, a printer, a fax machine, or non-visual displays such as audio output devices. The display subsystem may include a cathode ray tube (CRT), a flat panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 2610 to the user or to another machine or computer system.

Memory subsystem 2626 typically includes a number of memories including a main random-access memory (RAM) 2630 (or other volatile storage device) for storage of instructions and data during program execution and a read only memory (ROM) 2632 in which fixed instructions are stored. File storage subsystem 2628 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 2628.

Bus subsystem 2612 provides a device for letting the various components and subsystems of computer system 2610 communicate with each other as intended. Although bus subsystem 2612 is shown schematically as a single bus, alternative embodiments of the bus subsystem may use multiple busses. For example, RAM-based main memory can communicate directly with file storage systems using Direct Memory Access (DMA) systems.

FIG. 26B depicts a memory 2640 such as a non-transitory, computer readable data and information storage medium associated with file storage subsystem 2628, and/or with network interface subsystem 2616, and can include a data structure specifying a circuit design. The memory 2640 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 26C signifies an integrated circuit 2690 created with the described technology that includes one or more cells selected, for example, from a cell library.

DETAILED DESCRIPTION—TECHNOLOGY SUPPORT

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMS) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

DETAILED DESCRIPTION—TECHNOLOGY SUPPORT

EDA System/Workflow Explanation

Figure 25:
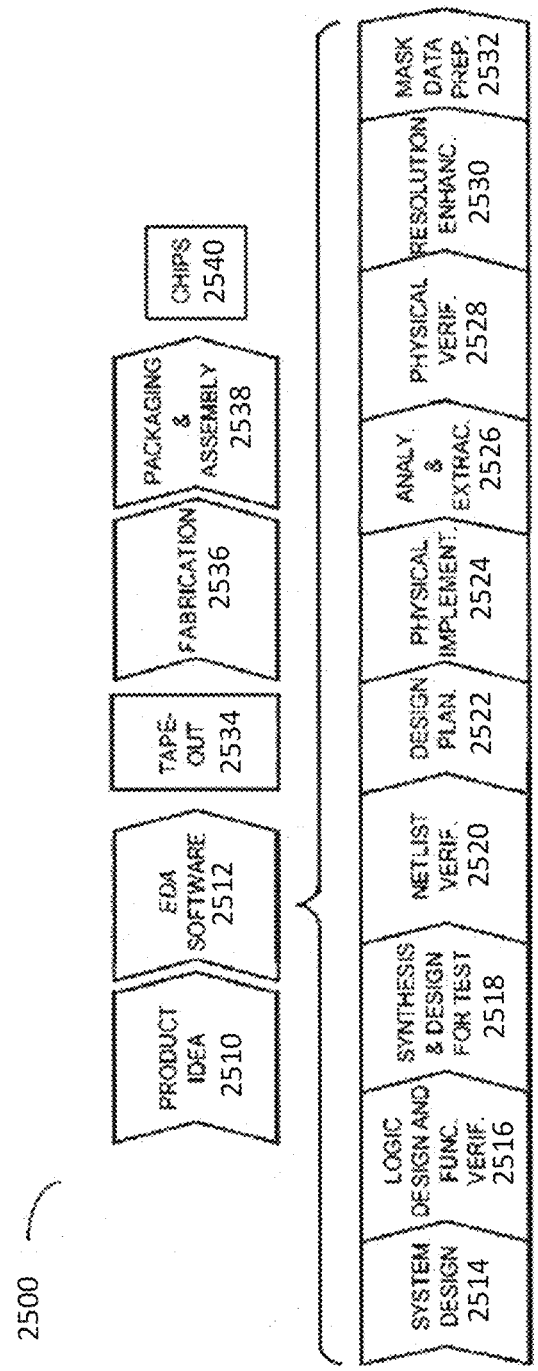
FIG. 25 illustrates various processes performed in the design and fabrication of an integrated circuit using software tools with a computer to transform data and instructions that represent the integrated circuit.

FIG. 25 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 2510 with information supplied by a designer, information which is transformed during a process to create an item of manufacture (referred to herein as a design or device) that uses an EDA software tool 2512, which may also be signified herein as EDA software, as a design tool, or a verification tool. When the design is finalized, it can be taped-out 2534, which typically is when artwork (e.g., geometric patterns) for the integrated circuit is sent to a fabrication facility, to fabricate the mask set, which is then used for fabricating the integrated circuit. After tape-out, a semiconductor die is fabricated 136 and packaging and assembly processes 2538 are performed, which result in the finished integrated circuit 140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 2512 includes tools 2514-2532, which are described below. This design flow description is for illustration purposes only and is not meant to limit the present disclosure. For example, an actual integrated circuit design may require a designer to perform the design operations in a different sequence than the sequence described herein.

During system design 2514, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 2516, modules in the circuit are specified in one or more hardware description languages, or HDLs, and the design in HDL is checked for functional accuracy, that is, to match the requirements of the specification of the circuit or system being designed. More specifically, the design is checked to ensure that it produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (®="Registered Trademark").

During logic synthesis and design for test 2518, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 2520, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 2522, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 2524, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 2526, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 2528, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 2530, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 2532, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 2512.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—TECHNOLOGY SUPPORT

Emulation Environment Explanation

An EDA software system, such as element 2512 depicted in FIG. 25, typically includes an emulation system 116 to verify the functionality of the circuit design. FIG. 26A depicts a typical emulation system which includes a host computer system (often part of an EDA system) and an emulator system (typically a set of programmable devices such as Field Programmable Gate Arrays (FPGAs)). A host system generates data and information, typically using a compiler, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

A host system can comprise one or more processors. In the embodiment where the host system is comprised of multiple processors, the functions described herein as being performed by the host system may be distributed among the multiple processors.

The host system typically includes a compiler that processes code written in a hardware description language that represents a DUT, producing data (typically binary) and information that is used to configure the emulation system to emulate the DUT. The compiler may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices). Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of or along with, the FPGAs for emulating DUTs, for example, custom FPGAs, specialized ASICs for emulation or prototyping, memories, and input/output devices.

A programmable device may include an array of programmable blocks and a hierarchy of reconfigurable interconnects that allow the programmable blocks to be connected to each other according to the descriptions in the HDL code. Each of the programmable blocks can be configured to perform complex combinational functions, or merely simple logic functions, such as AND, and XOR.

In many FPGAs, the blocks also include memory elements, which may be simple latches, flip-flops or more complex blocks of memory. Depending on the length of the interconnections between different logic blocks, signals may arrive at input terminals of the blocks at different times.

Programmable processors may be placed into one or more hardware boards. Many of such boards may be placed into a hardware unit. The boards within a unit may be connected using the backplane of the unit or any other types of connections. In addition, multiple hardware units may be connected to each other by cables or any other means to form a multi-unit system. In general, the hardware emulation or prototype system 202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA.

Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation.

Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A computer-implemented method of performing Voltage-based Design Rule Checking (VDRC) in a full-custom EDA Design and Implementation Platform, the method comprising:
   receiving a plurality of net voltages from at least a first net and a second net, wherein reception of the plurality of net voltages is from one or more of a simulation, a plurality of simulations, manual override, or direct input;
   determining a net voltage range, the net voltage range being a difference between a first net voltage of a first net and a second net voltage of a second net;
   causing transfer of the net voltage range to a layout editing process, the layout editing process resulting in generating a layout;
   performing VDRC verification, confirming VDRC clean layout; and
   accessing a VDRC configuration database, the VDRC configuration database configured to store design intent information comprising information indicating which one of one or more simulation results are to be used and information indicating designer override values.

2. The computer-implemented method of claim 1, wherein the first net voltage of the first net is a minimum net voltage of the first net and the second net voltage of the second net is a maximum net voltage of the second net.

3. The computer-implemented method of claim 1, wherein the VDRC configuration database is further configured to store design intent information comprising information indicating how multiple voltages from different simulations are to be aggregated and information indicating simulation node voltages.

4. The computer-implemented method of claim 3, further comprising:
   saving to a VDRC configuration database, the net voltage range for each design net determined during a dynamic simulation.

5. The computer-implemented method of claim 3, further comprising:
   generating the VDRC configuration database utilizing simulation waveform data from a previously performed simulation.

6. The computer-implemented method of claim 1, wherein receiving the voltages comprises:
   selectively querying, from the VDRC database, net voltages on all nets, which were obtained during a dynamic simulation.

7. The computer-implemented method of claim 6, wherein receiving the voltages comprises:
   allowing results of multiple dynamic simulations, each performed over at least one of a different pressure, volume, and temperature condition, or different testbench setup to be combined, resolved, or combined and resolved in the querying.

8. The computer-implemented method of claim 1, wherein receiving the voltages comprises:
   persisting, in the VDRC configuration database, user-specified preferences for resolving results of multiple dynamic simulations, enabling the results of multiple dynamic simulations to be resolved and used in future design sessions.

9. The computer-implemented method of claim 1, wherein receiving the voltages comprises:
   providing a user interface configured to allow user input indicating overriding voltage ranges in the layout via creation of vflag cells override.

10. The computer-implemented method of claim 1, further comprising:
    identifying and resolving one or more voltage range conflicts in the presence of hierarchical designs.

11. The computer-implemented method of claim 1, wherein receiving the voltages comprises:
    providing a user interface configured to receive, directly, voltage override data, without having first ran any simulations.

12. The computer-implemented method of claim 11, wherein the user interface is configured to receive, directly, the voltage override data via a tabular method to visualize and override the voltage ranges in a circuit schematic.

13. The computer-implemented method of claim 11, wherein the user interface is configured to receive, directly, the voltage override data via a graphical on-canvas method.

14. The computer-implemented method of claim 11, wherein the user interface is configured to receive, directly, the voltage override data via a tabular method to visualize and override the voltage ranges in a circuit schematic and via the graphical on-canvas method.

15. The computer-implemented method of claim 1, further comprising:
    providing a user interface configured to display simulation-based data, voltage override data, or the resolved data,
    wherein the voltage override data is of highest precedence.

16. The computer-implemented method of claim 1, further comprising:
    persisting the voltage range information and voltage override data to storage.

17. The computer-implemented method of claim 1, further comprising:
    allow dynamic simulation voltage range information to be persisted such that it can be shared across network partitions with different mount points, or to be managed, managing comprising being checked in and versioned.

18. The computer-implemented method of claim 1, further comprising:
    overriding the voltage ranges within the layout.

19. The computer-implemented method of claim 1, further comprising:
    receiving voltage override data for overriding the net voltage range in the layout via creation of vflag cells in the layout.

20. The computer-implemented method of claim 19, further comprising:
    enforcing the spacing rules during interactive operation of the layout editor.

21. The computer-implemented method of claim 20, further comprising:
    preventing any edits to any of the first net or second net that would result in a VDRC-related spacing violation.

22. The computer-implemented method of claim 20, further comprising:
  determining whether net voltage changes introduced subsequent to layout requires modifications to the layout.
23. The computer-implemented method of claim 1, further comprising:
  providing an indication, via the user interface, indicating whether the displayed voltage ranges have been explicitly overridden.
24. The computer-implemented method of claim 1, further comprising:
  causing display, via a user interface, of the voltage ranges within the layout.
25. The computer-implemented method of claim 1, further comprising:
  exporting a resolved set of voltage ranges using Verification-tool-specific encoding for final verification.
26. The computer-implemented method of claim 1, further comprising:
  causing display, via the user interface, of any VDRC violations, as determined during verification, in the context of the layout.
27. A system for performing Voltage-based Design Rule Checking (VDRC) in a full-custom EDA Design and Implementation Platform, the system comprising at least one processor and at least one memory including computer program code, the at least one memory and the computer program code configured to, with the processor, cause the system to at least:
  receive a plurality of net voltages from at least a first net and a second net, wherein reception of the plurality of net voltages is from one or more of a simulation, a plurality of simulations, manual override, or direct input;
  determine a net voltage range, the net voltage range being a difference between a first net voltage of a first net and a second net voltage of a second net;
  cause transfer of the net voltage range to a layout editing process, the layout editing process resulting in generating a layout;
  perform VDRC verification, confirming VDRC clean layout; and
  access a VDRC configuration database, the VDRC configuration database configured to store design intent information comprising information indicating which one of one or more simulation results are to be used and information indicating designer override values.
28. The system of claim 27,
  wherein the first net voltage of the first net is a minimum net voltage of the first net and the second net voltage of the second net is a maximum net voltage of the second net.
29. The system of claim 27, wherein
  the VDRC configuration database is further configured to store design intent information comprising information indicating how multiple voltages from different simulations are to be aggregated and information indicating simulation node voltages.
30. The system of claim 29, wherein the at least one memory and the computer program code are further configured to, with the processor, cause the system to:
  save to a VDRC configuration database, the net voltage range for each design net determined during a dynamic simulation.
31. The system of claim 29, wherein the at least one memory and the computer program code are further configured to, with the processor, cause the system to:
  generate the VDRC configuration database utilizing simulation waveform data from a previously performed simulation.
32. The system of claim 27, wherein receiving the voltages comprises:
  selectively query, from the VDRC database, net voltages on all nets, which were obtained during a dynamic simulation.
33. The system of claim 32, wherein receiving the voltages comprises:
  allow results of multiple dynamic simulations, each performed over at least one of a different pressure, volume, and temperature condition, or different test bench setup to be combined, resolved, or combined and resolved in the querying.
34. The system of claim 27, wherein receiving the voltages comprises:
  persist, in the VDRC configuration database, user-specified preferences for resolving results of multiple dynamic simulations, enabling the results of multiple dynamic simulations to be resolved and used in future design sessions.
35. The system of claim 27, wherein receiving the voltages comprises:
  provide a user interface configured to allow user input indicating overriding voltage ranges in the layout via creation of vflag cells override.
36. The system of claim 27, wherein the at least one memory and the computer program code are further configured to, with the processor, cause the system to:
  identify and resolve one or more voltage range conflicts in the presence of hierarchical designs.
37. The system of claim 27, wherein receiving the voltages comprises:
  provide a user interface configured to receive, directly, voltage override data, without having first ran any simulations.
38. The system of claim 37, wherein the user interface is configured to receive, directly, the voltage override data via a tabular method to visualize and override the voltage ranges in a circuit schematic.
39. The system of claim 37, wherein the user interface is configured to receive, directly, the voltage override data via a graphical on-canvas method.
40. The system of claim 37, wherein the user interface is configured to receive, directly, the voltage override data via a tabular method to visualize and override the voltage ranges in a circuit schematic and via the graphical on-canvas method.
41. The system of claim 27, wherein the at least one memory and the computer program code are further configured to, with the processor, cause the system to:
  provide a user interface configured to display simulation-based data, voltage override data, or the resolved data, wherein the voltage override data is of highest precedence.
42. The system of claim 27, wherein the at least one memory and the computer program code are further configured to, with the processor, cause the system to:
  persist the voltage range information and voltage override data to storage.
43. The system of claim 27, wherein the at least one memory and the computer program code are further configured to, with the processor, cause the system to: allow dynamic simulation voltage range information to be persisted such that it can be shared across network partitions with different mount points, or to be managed, managing comprising being checked in and versioned.

44. The system of claim 27, wherein the at least one memory and the computer program code are further configured to, with the processor, cause the system to: identify and resolve any voltage range conflicts in the presence of hierarchical designs.

45. The system of claim 27, wherein the at least one memory and the computer program code are further configured to, with the processor, cause the system to: override the voltage ranges within the layout.

46. The system of claim 27, wherein the at least one memory and the computer program code are further configured to, with the processor, cause the system to:
receive voltage override data for overriding the net voltage range in the layout via creation of vflag cells in the layout.

47. The system of claim 46, wherein the at least one memory and the computer program code are further configured to, with the processor, cause the system to: enforce the spacing rules during interactive operation of the layout editor.

48. The system of claim 47, wherein the at least one memory and the computer program code are further configured to, with the processor, cause the system to:
prevent any edits to any of the first net or second net that would result in a VDRC-related spacing violation.

49. The system of claim 47, wherein the at least one memory and the computer program code are further configured to, with the processor, cause the system to:
determine whether net voltage changes introduced subsequent to layout requires modifications to the layout.

50. The system of claim 27, wherein the at least one memory and the computer program code are further configured to, with the processor, cause the system to:
provide an indication, via the user interface, indicating whether the displayed voltage ranges have been explicitly overridden.

51. The system of claim 27, wherein the at least one memory and the computer program code are further configured to, with the processor, cause the system to:
cause display, via a user interface, of the voltage ranges within the layout.

52. The system of claim 27, wherein the at least one memory and the computer program code are further configured to, with the processor, cause the system to:
export a resolved set of voltage ranges using verification-tool-specific encoding for final verification.

53. The system of claim 27, wherein the at least one memory and the computer program code are further configured to, with the processor, cause the system to:
cause display, via the user interface, of any VDRC violations, as determined during verification, in the context of the layout.

* * * * *